(12) United States Patent
Saiki et al.

(10) Patent No.: US 8,188,545 B2
(45) Date of Patent: May 29, 2012

(54) INTEGRATED CIRCUIT DEVICE AND ELECTRONIC INSTRUMENT

(75) Inventors: Takayuki Saiki, Suwa (JP); Satoru Ito, Okaya (JP); Masahiko Moriguchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 1328 days.

(21) Appl. No.: 11/703,686

(22) Filed: Feb. 8, 2007

(65) Prior Publication Data
US 2007/0187762 A1 Aug. 16, 2007

(30) Foreign Application Priority Data
Feb. 10, 2006 (JP) .................. 2006-034518

(51) Int. Cl.
*H01L 23/62* (2006.01)
*H02H 9/00* (2006.01)
*G02B 6/26* (2006.01)

(52) U.S. Cl. ........ 257/355; 257/357; 257/360; 257/361; 257/368; 257/546; 257/E23.153; 257/E23.02; 257/E23.023; 257/E21.016; 349/40; 345/50; 345/92; 345/204; 361/56; 365/230.03

(58) Field of Classification Search .......... 257/355, 257/357, 360, 361, 368, 546, E23.153, E23.02, 257/E23.023, E27.016; 349/40; 345/50, 345/92, 204; 361/56; 365/230.03
See application file for complete search history.

(56) References Cited

U.S. PATENT DOCUMENTS

| | | | |
|---|---|---|---|
| 4,456,977 A | 6/1984 | Hayashi | |
| 4,472,638 A | 9/1984 | Nishizawa et al. | |
| 4,549,174 A | 10/1985 | Funada et al. | |
| 4,566,038 A | 1/1986 | Dimick | |
| 4,587,629 A | 5/1986 | Dill et al. | |
| 4,648,077 A | 3/1987 | Pinkham et al. | |
| 4,975,753 A | 12/1990 | Ema | |
| 4,990,996 A | 2/1991 | Kumar et al. | |
| 5,001,108 A | 3/1991 | Taguchi | |
| 5,040,152 A | 8/1991 | Voss et al. | |
| 5,058,058 A | 10/1991 | Yasuda et al. | |
| 5,233,420 A | 8/1993 | Piri et al. | |
| 5,267,211 A | 11/1993 | Kobayashi et al. | |
| 5,272,665 A | 12/1993 | Uesugi | |
| 5,325,338 A | 6/1994 | Runaldue et al. | |
| 5,414,443 A | 5/1995 | Kanatani et al. | |
| 5,426,603 A | 6/1995 | Nakamura et al. | |
| 5,490,114 A | 2/1996 | Butler et al. | |

(Continued)

FOREIGN PATENT DOCUMENTS

CN 1534560 10/2004

(Continued)

OTHER PUBLICATIONS

T. Kumagai et al; U.S. Appl. No. 11/477,720, filed Jun. 30, 2006.

(Continued)

*Primary Examiner* — Dao H Nguyen
(74) *Attorney, Agent, or Firm* — Oliff & Berridge, PLC

(57) ABSTRACT

A semiconductor integrated circuit includes N pad rows in which pads are respectively arranged, and electrostatic discharge protection elements disposed in a lower layer of the N pad rows and connected with each pad in the N pad rows. The electrostatic discharge protection elements are disposed in a lower layer of regions at least partially including each of the N pads.

16 Claims, 20 Drawing Sheets

U.S. PATENT DOCUMENTS

| | | | |
|---|---|---|---|
| 5,517,051 | A | 5/1996 | Chatterjee |
| 5,544,306 | A | 8/1996 | Deering et al. |
| 5,555,209 | A | 9/1996 | Smith et al. |
| 5,598,346 | A | 1/1997 | Agrawal et al. |
| 5,652,689 | A * | 7/1997 | Yuan .......................... 361/56 |
| 5,659,514 | A | 8/1997 | Hazani |
| 5,701,269 | A | 12/1997 | Fujii |
| 5,739,803 | A | 4/1998 | Neugebauer |
| 5,744,837 | A * | 4/1998 | Kamiura et al. .............. 257/355 |
| 5,751,065 | A | 5/1998 | Chittipeddi et al. |
| 5,767,865 | A | 6/1998 | Inoue et al. |
| 5,815,136 | A | 9/1998 | Ikeda et al. |
| 5,850,195 | A | 12/1998 | Berlien, Jr. et al. |
| 5,860,084 | A | 1/1999 | Yaguchi |
| RE36,089 | E | 2/1999 | Ooishi et al. |
| 5,903,420 | A | 5/1999 | Ham |
| 5,909,125 | A | 6/1999 | Kean |
| 5,917,770 | A | 6/1999 | Tanaka |
| 5,920,885 | A | 7/1999 | Rao |
| 5,933,364 | A | 8/1999 | Aoyama et al. |
| 5,962,899 | A | 10/1999 | Yang et al. |
| 6,005,296 | A | 12/1999 | Chan |
| 6,025,822 | A | 2/2000 | Motegi et al. |
| 6,034,541 | A | 3/2000 | Kopec, Jr. et al. |
| 6,111,786 | A | 8/2000 | Nakamura |
| 6,118,425 | A | 9/2000 | Kudo et al. |
| 6,125,021 | A | 9/2000 | Duvvury et al. |
| 6,140,983 | A | 10/2000 | Quanrud |
| 6,225,990 | B1 | 5/2001 | Aoki et al. |
| 6,229,336 | B1 | 5/2001 | Felton et al. |
| 6,229,753 | B1 | 5/2001 | Kono et al. |
| 6,246,386 | B1 | 6/2001 | Perner |
| 6,259,459 | B1 | 7/2001 | Middleton |
| 6,262,541 | B1 | 7/2001 | Asai |
| 6,278,148 | B1 | 8/2001 | Watanabe et al. |
| 6,324,088 | B1 | 11/2001 | Keeth et al. |
| 6,339,417 | B1 | 1/2002 | Quanrud |
| 6,340,963 | B1 * | 1/2002 | Anno et al. ....................... 345/92 |
| 6,421,286 | B1 | 7/2002 | Ohtani et al. |
| 6,489,689 | B2 | 12/2002 | Nojiri |
| 6,552,705 | B1 | 4/2003 | Hirota |
| 6,559,508 | B1 | 5/2003 | Lin et al. |
| 6,580,631 | B1 | 6/2003 | Keeth et al. |
| 6,611,407 | B1 | 8/2003 | Chang |
| 6,646,283 | B1 | 11/2003 | Akimoto et al. |
| 6,697,037 | B1 | 2/2004 | Alt et al. |
| 6,724,378 | B2 | 4/2004 | Tamura et al. |
| 6,731,538 | B2 | 5/2004 | Noda et al. |
| 6,791,632 | B2 * | 9/2004 | Lee et al. ....................... 349/40 |
| 6,822,631 | B1 | 11/2004 | Yatabe |
| 6,826,116 | B2 | 11/2004 | Noda et al. |
| 6,839,097 | B2 * | 1/2005 | Park et al. ....................... 349/40 |
| 6,858,901 | B2 | 2/2005 | Ker et al. |
| 6,862,247 | B2 | 3/2005 | Yamazaki |
| 6,873,310 | B2 | 3/2005 | Matsueda |
| 6,873,566 | B2 | 3/2005 | Choi |
| 6,898,096 | B2 | 5/2005 | Endo et al. |
| 6,999,353 | B2 | 2/2006 | Noda et al. |
| 7,034,792 | B2 | 4/2006 | Tamura |
| 7,078,948 | B2 | 7/2006 | Dosho |
| 7,081,879 | B2 | 7/2006 | Sun et al. |
| 7,102,223 | B1 | 9/2006 | Kanaoka et al. |
| 7,110,274 | B1 | 9/2006 | Endo et al. |
| 7,142,221 | B2 | 11/2006 | Sakamaki et al. |
| 7,158,439 | B2 | 1/2007 | Shionori et al. |
| 7,164,415 | B2 | 1/2007 | Ooishi et al. |
| 7,176,864 | B2 | 2/2007 | Moriyama et al. |
| 7,180,495 | B1 | 2/2007 | Matsueda |
| 7,193,623 | B2 | 3/2007 | Moon |
| 7,233,511 | B2 | 6/2007 | Endo et al. |
| 7,256,976 | B2 | 8/2007 | Sato |
| 7,280,329 | B2 | 10/2007 | Kim et al. |
| 7,317,627 | B2 | 1/2008 | Endo et al. |
| 7,330,163 | B2 | 2/2008 | Nakai et al. |
| 7,342,302 | B2 | 3/2008 | Kanaoka et al. |
| 7,369,195 | B2 | 5/2008 | Wu et al. |
| 7,391,668 | B2 | 6/2008 | Natori et al. |
| 7,411,804 | B2 | 8/2008 | Kumagai et al. |
| 7,411,861 | B2 | 8/2008 | Kodaira et al. |
| 7,466,603 | B2 | 12/2008 | Ong |
| 7,471,573 | B2 | 12/2008 | Kodaira et al. |
| 7,480,164 | B2 | 1/2009 | Endo et al. |
| 7,522,441 | B2 | 4/2009 | Kumagai et al. |
| 7,629,652 | B2 | 12/2009 | Suzuki et al. |
| 7,759,804 | B2 | 7/2010 | Kanaoka et al. |
| 7,940,500 | B2 * | 5/2011 | Yang et al. ....................... 361/56 |
| 8,054,710 | B2 * | 11/2011 | Ito et al. ................... 365/230.03 |
| 2001/0008498 | A1 | 7/2001 | Ooishi |
| 2001/0014051 | A1 | 8/2001 | Watanabe et al. |
| 2001/0022744 | A1 | 9/2001 | Noda et al. |
| 2002/0011998 | A1 | 1/2002 | Tamura |
| 2002/0013783 | A1 | 1/2002 | Rising, III et al. |
| 2002/0015128 | A1 | 2/2002 | Sakaguchi |
| 2002/0036625 | A1 | 3/2002 | Nakamura |
| 2002/0067328 | A1 | 6/2002 | Yumoto et al. |
| 2002/0080104 | A1 | 6/2002 | Aoki |
| 2002/0105510 | A1 | 8/2002 | Tsuchiya |
| 2002/0126108 | A1 | 9/2002 | Koyama et al. |
| 2002/0154557 | A1 | 10/2002 | Mizugaki et al. |
| 2003/0020845 | A1 | 1/2003 | Lee et al. |
| 2003/0034948 | A1 | 2/2003 | Imamura |
| 2003/0053022 | A1 | 3/2003 | Kaneko et al. |
| 2003/0053321 | A1 | 3/2003 | Ishiyama |
| 2003/0156103 | A1 | 8/2003 | Ota |
| 2003/0169244 | A1 | 9/2003 | Kurokawa et al. |
| 2003/0189541 | A1 | 10/2003 | Hashimoto |
| 2003/0223164 | A1 | 12/2003 | Ebara |
| 2004/0004877 | A1 | 1/2004 | Uetake |
| 2004/0017341 | A1 | 1/2004 | Maki |
| 2004/0021652 | A1 | 2/2004 | Abe et al. |
| 2004/0021947 | A1 | 2/2004 | Schofield et al. |
| 2004/0056252 | A1 | 3/2004 | Kasai |
| 2004/0070900 | A1 | 4/2004 | Ker et al. |
| 2004/0095307 | A1 | 5/2004 | Kim |
| 2004/0124472 | A1 | 7/2004 | Lin et al. |
| 2004/0140970 | A1 | 7/2004 | Morita |
| 2004/0164943 | A1 | 8/2004 | Ogawa et al. |
| 2004/0174646 | A1 | 9/2004 | Ko |
| 2004/0239606 | A1 | 12/2004 | Ota |
| 2004/0246215 | A1 | 12/2004 | Yoo |
| 2005/0001797 | A1 | 1/2005 | Miller et al. |
| 2005/0001846 | A1 | 1/2005 | Shiono |
| 2005/0045955 | A1 | 3/2005 | Kim et al. |
| 2005/0047266 | A1 | 3/2005 | Shionori et al. |
| 2005/0052340 | A1 | 3/2005 | Goto et al. |
| 2005/0057580 | A1 | 3/2005 | Yamano et al. |
| 2005/0057581 | A1 | 3/2005 | Horiuchi et al. |
| 2005/0073470 | A1 | 4/2005 | Nose et al. |
| 2005/0087807 | A1 | 4/2005 | Righter |
| 2005/0093777 | A1 | 5/2005 | Kim et al. |
| 2005/0116960 | A1 | 6/2005 | Shioda et al. |
| 2005/0122303 | A1 | 6/2005 | Hashimoto |
| 2005/0184979 | A1 | 8/2005 | Sakaguchi |
| 2005/0195149 | A1 | 9/2005 | Ito |
| 2005/0212788 | A1 | 9/2005 | Fukuda et al. |
| 2005/0212826 | A1 | 9/2005 | Fukuda et al. |
| 2005/0219189 | A1 | 10/2005 | Fukuo |
| 2005/0243043 | A1 | 11/2005 | Jeoung et al. |
| 2005/0253976 | A1 | 11/2005 | Sekiguchi et al. |
| 2005/0262293 | A1 | 11/2005 | Yoon |
| 2005/0270262 | A1 | 12/2005 | Oh |
| 2005/0280613 | A1 | 12/2005 | Takei et al. |
| 2005/0285862 | A1 | 12/2005 | Noda et al. |
| 2006/0017681 | A1 | 1/2006 | Jang et al. |
| 2006/0028417 | A1 | 2/2006 | Harada et al. |
| 2006/0050042 | A1 | 3/2006 | Yi |
| 2006/0062483 | A1 | 3/2006 | Kondo et al. |
| 2006/0145972 | A1 | 7/2006 | Zhang et al. |
| 2006/0244710 | A1 | 11/2006 | Iriguchi et al. |
| 2007/0000971 | A1 | 1/2007 | Kumagai et al. |
| 2007/0001886 | A1 | 1/2007 | Ito et al. |
| 2007/0001968 | A1 | 1/2007 | Kodaira et al. |
| 2007/0001969 | A1 | 1/2007 | Kodaira et al. |
| 2007/0001970 | A1 | 1/2007 | Kodaira et al. |
| 2007/0001971 | A1 | 1/2007 | Kumagai et al. |
| 2007/0001972 | A1 | 1/2007 | Kumagai et al. |
| 2007/0001973 | A1 | 1/2007 | Kumagai et al. |

| | | | | | | |
|---|---|---|---|---|---|---|
| 2007/0001974 | A1 | 1/2007 | Kumagai et al. | JP | A-2002-313925 | 10/2002 |
| 2007/0001975 | A1 | 1/2007 | Kumagai et al. | JP | A-2002-358777 | 12/2002 |
| 2007/0001982 | A1 | 1/2007 | Ito et al. | JP | A 2003-022063 | 1/2003 |
| 2007/0001983 | A1 | 1/2007 | Ito et al. | JP | A-2003-23092 | 1/2003 |
| 2007/0001984 | A1 | 1/2007 | Kumagai et al. | JP | A-2003-107528 | 4/2003 |
| 2007/0002061 | A1 | 1/2007 | Kumagai et al. | JP | A-2003-203984 | 7/2003 |
| 2007/0002062 | A1 | 1/2007 | Kodaira et al. | JP | A-2003-289104 | 10/2003 |
| 2007/0002063 | A1 | 1/2007 | Kumagai et al. | JP | A 2003-330433 | 11/2003 |
| 2007/0002188 | A1 | 1/2007 | Kumagai et al. | JP | A 2004-040042 | 2/2004 |
| 2007/0002667 | A1 | 1/2007 | Kodaira et al. | JP | A-2004-95577 | 3/2004 |
| 2007/0002669 | A1 | 1/2007 | Kodaira et al. | JP | A 2004-146806 | 5/2004 |
| 2007/0002670 | A1 | 1/2007 | Kodaira et al. | JP | A 2004-159314 | 6/2004 |
| 2007/0002671 | A1 | 1/2007 | Kumagai et al. | JP | A 2004-328456 | 11/2004 |
| 2007/0013074 | A1 | 1/2007 | Kodaira et al. | JP | A 2005-17725 | 1/2005 |
| 2007/0013634 | A1 | 1/2007 | Saiki et al. | JP | A 2005-72607 | 3/2005 |
| 2007/0013635 | A1 | 1/2007 | Ito et al. | JP | A-2005-085820 | 3/2005 |
| 2007/0013684 | A1 | 1/2007 | Kodaira et al. | JP | A-2005-150559 | 6/2005 |
| 2007/0013685 | A1 | 1/2007 | Kodaira et al. | JP | A-2005-167212 | 6/2005 |
| 2007/0013687 | A1 | 1/2007 | Kodaira et al. | JP | A-2006-228770 | 8/2006 |
| 2007/0013706 | A1 | 1/2007 | Kodaira et al. | KR | A 1992-17106 | 9/1992 |
| 2007/0013707 | A1 | 1/2007 | Kodaira et al. | KR | 1999-88197 | 12/1999 |
| 2007/0016700 | A1 | 1/2007 | Kodaira et al. | KR | A 2001-100814 | 11/2001 |
| 2007/0035503 | A1 | 2/2007 | Kurokawa et al. | KR | 10-2005-0011743 | 1/2005 |
| 2010/0059882 | A1 | 3/2010 | Suzuki et al. | TW | 501080 | 9/2002 |
| 2010/0252924 | A1 | 10/2010 | Kanaoka et al. | TW | 522366 | 3/2003 |
| | | | | TW | 525134 | 3/2003 |
| | | | | TW | I224300 | 3/2003 |
| | | | | TW | 563081 | 11/2003 |
| | | | | WO | WO 2004-25849 A1 | 3/2004 |

FOREIGN PATENT DOCUMENTS

| | | |
|---|---|---|
| CN | 1542964 | 11/2004 |
| EP | 0 499 478 A2 | 8/1992 |
| JP | A-56-130888 | 10/1981 |
| JP | A 63-225993 | 9/1988 |
| JP | A 1-171190 | 7/1989 |
| JP | A-2-79294 | 3/1990 |
| JP | A 4-370595 | 12/1992 |
| JP | A 5-181154 | 7/1993 |
| JP | A-05-189957 | 7/1993 |
| JP | A-8-181219 | 7/1995 |
| JP | A 7-281634 | 10/1995 |
| JP | A 8-69696 | 3/1996 |
| JP | A-8-236706 | 9/1996 |
| JP | A-9-265274 | 10/1997 |
| JP | A 11-261011 | 9/1999 |
| JP | A 11-274424 | 10/1999 |
| JP | A 11-330393 | 11/1999 |
| JP | A-2000-020032 | 1/2000 |
| JP | A-2000-252435 | 9/2000 |
| JP | A-2001-067868 | 3/2001 |
| JP | A-2001-222249 | 8/2001 |
| JP | A 2001-222276 | 8/2001 |
| JP | A-2002-6334 | 1/2002 |
| JP | A-2002-83933 | 3/2002 |
| JP | A-2002-182232 | 6/2002 |
| JP | A 2002-244624 | 8/2002 |

OTHER PUBLICATIONS

Office Action issued in Japanese Patent Application No. 2006-154200 on Jun. 19, 2007 (w/English-language Translation).
U.S. Appl. No. 12/000,882, filed Dec. 18, 2007 in the name of Kodaira et al.
Sedra & Smith, Microelectronic Circuit (Jun. 1990), Saunder College Publishing, $3^{rd}$ Edition, Chapter 5, p. 300.
Aug. 5, Notice of Allowance issued in U.S. Appl. No. 11/477,720.
Aug. 10, 2011 Notice of Allowance issued in U.S. Appl. No. 11/477,670.
Office Action dated Nov. 3, 2011 issued in U.S. Appl. No. 11/477,714.
Nov. 22, 2011 Office Action issued in Japanese Application No. 2008-035576 (with translation).
Nov. 22, 2011 Office Action issued in Japanese Application No. 2008-124746 (with translation).
Nov. 29, 2011 Office Action issued in U.S. Appl. No. 11/477,741.
Jan. 18, 2012 Notice of Allowance issued in U.S. Appl. No. 11/477,720.
Mar. 16, 2012 Office Action issued in U.S. Appl. No. 11/477,714.

* cited by examiner

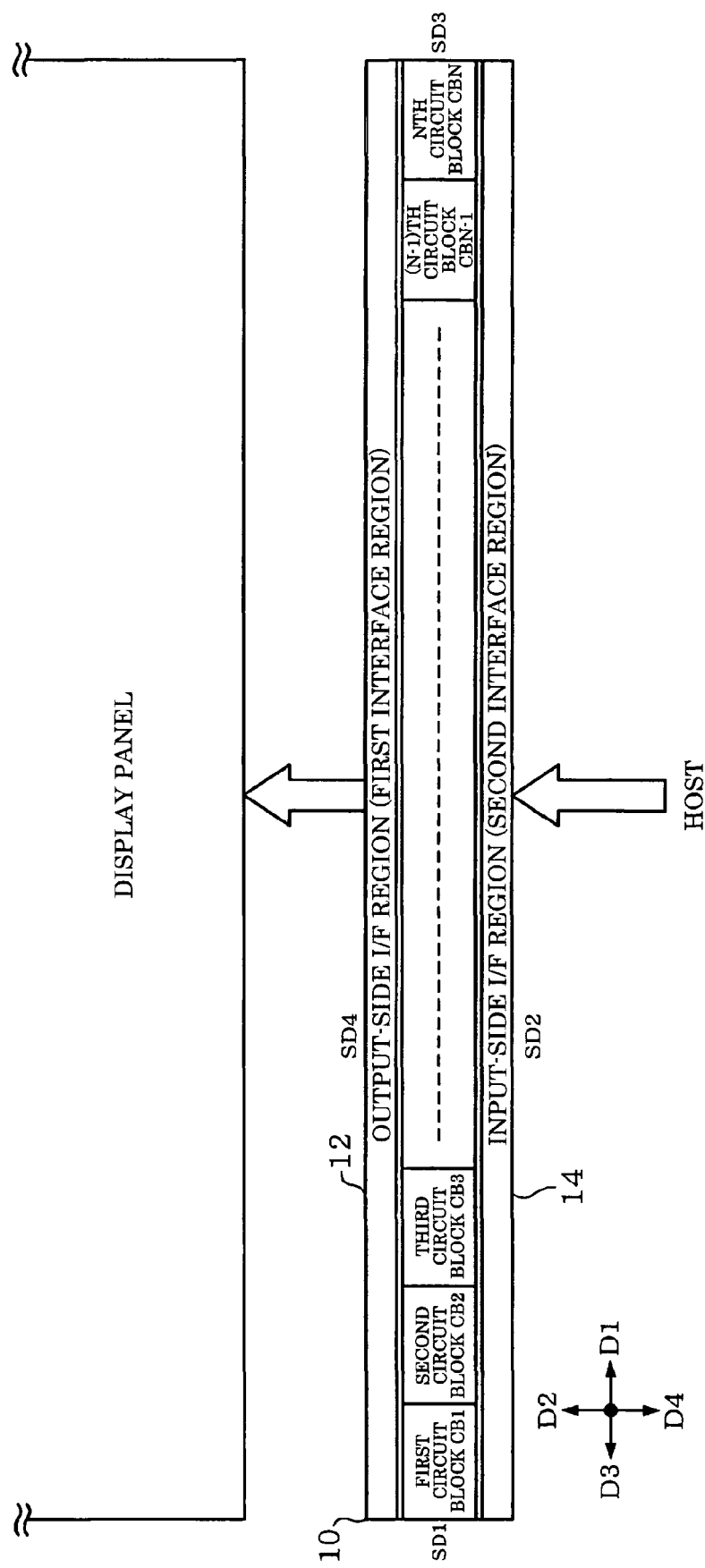

FIG. 4

| | WITH MEMORY (RAM) | | WITHOUT MEMORY | | CSTN | TFD |
|---|---|---|---|---|---|---|
| | AMORPHOUS TFT | LOW-TEMPERATURE POLYSILICON TFT | AMORPHOUS TFT | LOW-TEMPERATURE POLYSILICON TFT | | |
| MEMORY (RAM) | INCLUDE | INCLUDE | NOT INCLUDE | NOT INCLUDE | INCLUDE | INCLUDE |
| DATA DRIVER | INCLUDE | INCLUDE | INCLUDE | INCLUDE | INCLUDE | INCLUDE |
| SCAN DRIVER | INCLUDE | NOT INCLUDE | INCLUDE | NOT INCLUDE | INCLUDE | INCLUDE |
| LOGIC CIRCUIT (G/A) | INCLUDE | INCLUDE | INCLUDE | INCLUDE | INCLUDE | INCLUDE |
| GRAYSCALE VOLTAGE GENERATION CIRCUIT ($\gamma$) | INCLUDE | INCLUDE | INCLUDE | INCLUDE | NOT INCLUDE | NOT INCLUDE |
| POWER SUPPLY CIRCUIT | INCLUDE | INCLUDE | INCLUDE | INCLUDE | INCLUDE | INCLUDE |

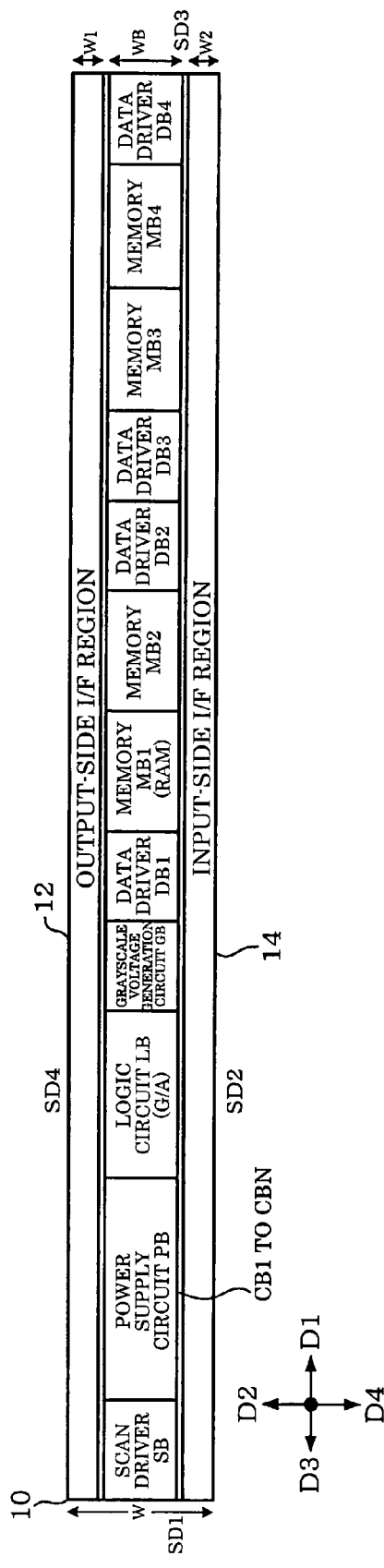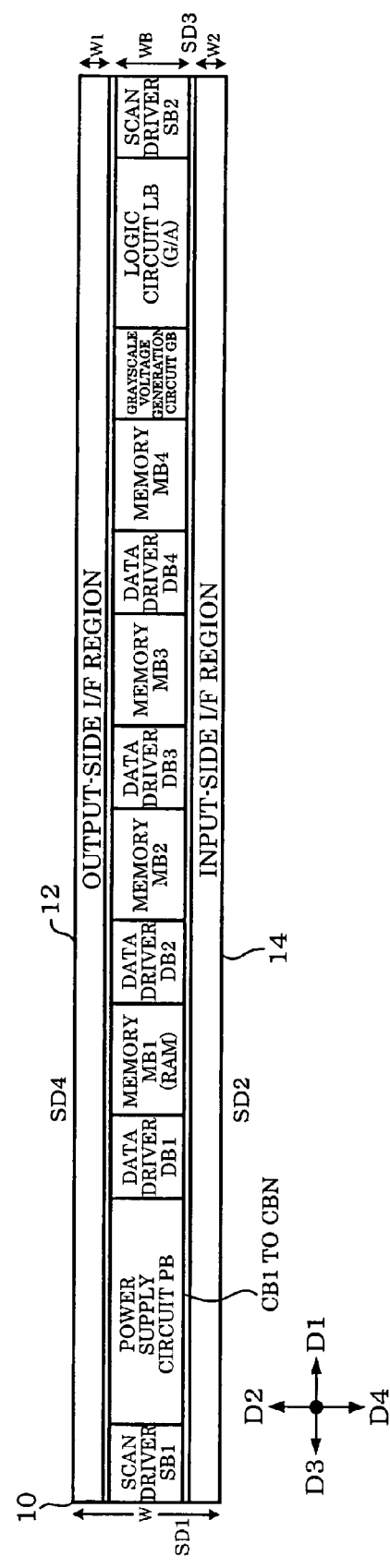

FIG. 11
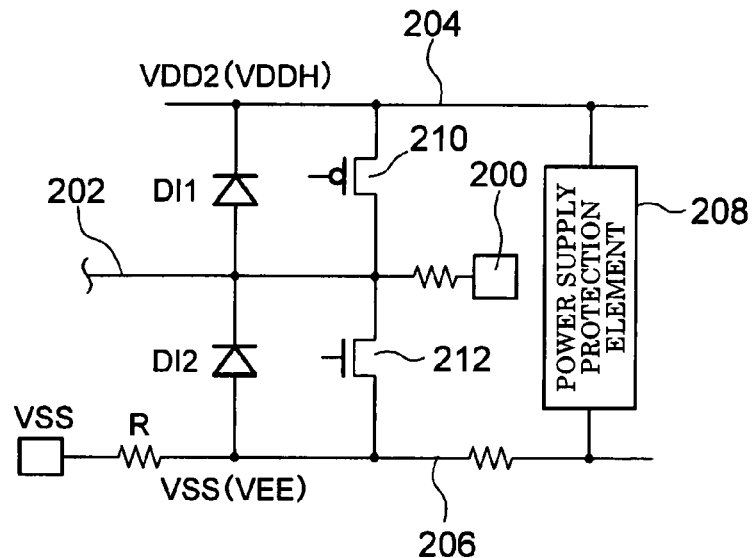
FIG. 12
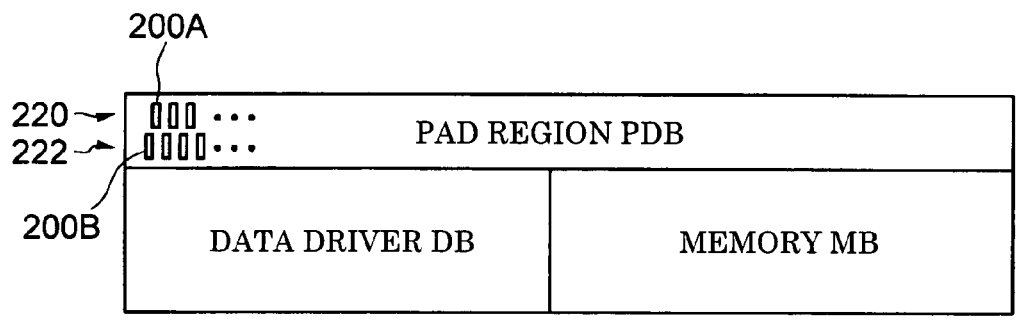
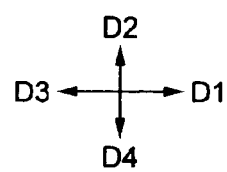

XV-XV CROSS SECTION

XVI-XVI CROSS SECTION

NORMAL "1" OUTPUT

ABNORMAL "0" OUTPUT

XXI-XXI CROSS SECTION

US 8,188,545 B2

INTEGRATED CIRCUIT DEVICE AND ELECTRONIC INSTRUMENT

Japanese Patent Application No. 2006-034518 filed on Feb. 10, 2006, is hereby incorporated by reference in its entirety.

BACKGROUND OF THE INVENTION

The present invention relates to an integrated circuit device and an electronic instrument.

A display driver (LCD driver) has been known as an integrated circuit device which drives a display panel such as a liquid crystal panel (e.g. JP-A-2001-222249). A reduction in chip size is required for the display driver in order to reduce cost.

On the other hand, a display panel incorporated in a portable telephone or the like has approximately the same size. Therefore, when reducing the chip size by merely shrinking the integrated circuit device (display driver) using microfabrication technology, it becomes difficult to mount the integrated circuit device.

SUMMARY

According to one aspect of the present invention, there is provided a semiconductor integrated circuit comprising:

N (N is an integer equal to or larger than two) pad rows disposed at intervals in a first direction, a plurality of pads being arranged in each of the N pad rows at intervals in a second direction perpendicular to the first direction; and a plurality of electrostatic discharge protection elements disposed in a lower layer of the N pad rows and respectively connected with one of the pads in the N pad rows;

wherein at least N electrostatic discharge protection elements are connected with N pads each of which is a different and adjacent pad belonging in each of the N pad rows, and the at least N electrostatic discharge protection elements are disposed in a lower layer of regions at least partially including each of the N pads.

BRIEF DESCRIPTION OF THE SEVERAL VIEWS OF THE DRAWING

FIG. 3 is a configuration example of an integrated circuit device according to one embodiment of the invention.

FIG. 4 is an example of various types of display drivers and circuit blocks provided in the display drivers.

FIGS. 5A and 5B are planar layout examples of the integrated circuit device according to one embodiment of the invention.

FIG. 11 is a view showing a pad and an electrostatic discharge protection element which protects the pad.

FIG. 12 is a view showing a macrocell of pads, a memory, and a data driver.

DETAILED DESCRIPTION OF THE EMBODIMENT

Figure 1A:
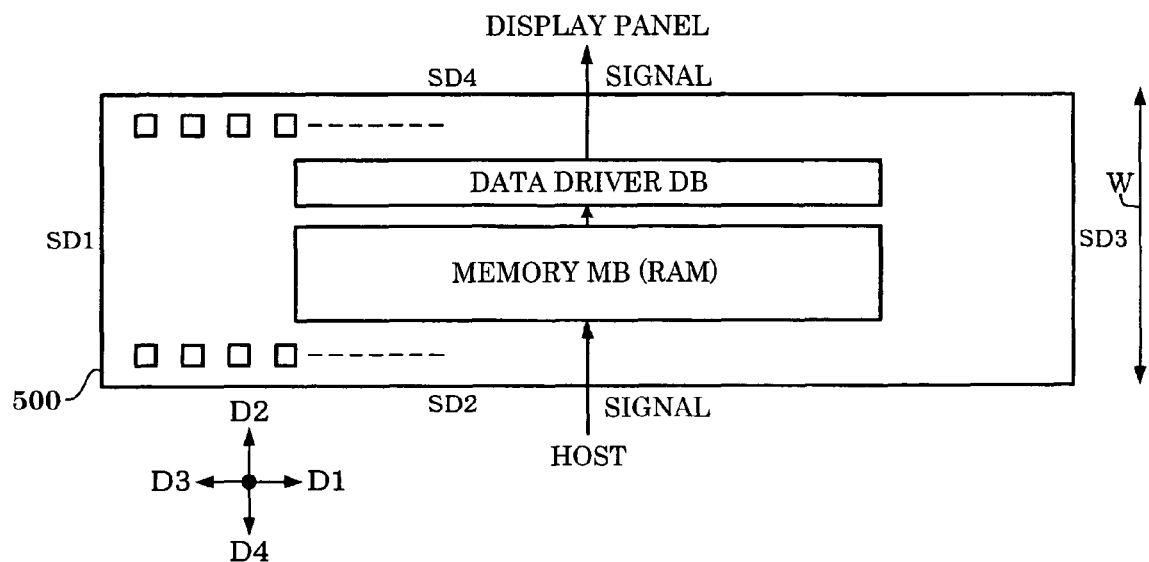
FIGS. 1A, 1B, and 1C are illustrative of a comparative example of one embodiment of the invention.

The invention has been achieved in view of the above-described technical problem. An objective of the invention is to provide a slim and narrow integrated circuit device provided with measures against static electricity, and an electronic instrument including the same.

According to one embodiment of the invention, there is provided a semiconductor integrated circuit comprising:

N (N is an integer equal to or larger than two) pad rows disposed at intervals in a first direction, a plurality of pads being arranged in each of the N pad rows at intervals in a second direction perpendicular to the first direction; and a plurality of electrostatic discharge protection elements disposed in a lower layer of the N pad rows and respectively connected with one of the pads in the N pad rows;

wherein at least N electrostatic discharge protection elements are connected with N pads each of which is a different and adjacent pad belonging in each of the N pad rows, and the at least N electrostatic discharge protection elements are disposed in a lower layer of regions at least partially including each of the N pads.

According to one embodiment of the invention, the electrostatic discharge protection elements connected with the pads in the N pad rows can be disposed in a lower layer of the N pad rows. Therefore, the dimension of the semiconductor integrated circuit in the first direction perpendicular to the pad arrangement direction (second direction) can be reduced, whereby a narrow semiconductor integrated circuit can be provided. For example, when N=2, the electrostatic discharge protection elements connected with two pads in the two pad rows can be disposed in a lower layer of the two pads, whereby the degrees of freedom of the layout can be increased and the interconnect impedance can be reduced in comparison with the case of disposing the electrostatic discharge protection elements under one pad.

According to one embodiment of the invention, each of the at least N electrostatic discharge protection elements may include a first electrostatic discharge protection element connected between a first power supply line and one pad among the pads, and a second electrostatic discharge protection element connected between a second power supply line having a potential lower than a potential of the first power supply line and the one pad. Each of the pads may be formed in an approximately rectangular shape having a long side along the first direction and a short side along the second direction, and an impurity layer of each of the first and second electrostatic discharge protection elements connected with the N pads may have a shape in which a dimension in the second direction is greater than a dimension in the first direction.

This enables the width of the interconnect which connects the pad and the electrostatic discharge protection element to be increased, whereby the interconnect impedance is reduced.

According to one embodiment of the invention, one of the first and second electrostatic discharge protection elements connected with the pad in the first row may be formed in a region positioned in a lower layer of the pad in the first row, the other of the first and second electrostatic discharge protection elements connected with the pad in the Nth row may be formed in a region positioned in a lower layer of the pad in the Nth row, the N first electrostatic discharge protection elements may be adjacently disposed in the first direction, and the N second electrostatic discharge protection elements may be adjacently disposed in the first direction.

This allows the same type of electrostatic discharge protection elements to be collectively formed in one place. Therefore, well separation becomes unnecessary when well separation is required between different types of electrostatic discharge protection elements, whereby the width of the semiconductor integrated circuit can be reduced.

According to one embodiment of the invention, a first well in which the N first electrostatic discharge protection elements are formed may be formed along the second direction, and a second well in which the N second electrostatic discharge protection elements are formed may be formed along the second direction, and the first and second wells may be separated in the first direction.

Specifically, it suffices to provide only one well separation even if well separation is necessary between different types of electrostatic discharge protection elements.

According to one embodiment of the invention, each of the second electrostatic discharge protection elements may be disposed in a triple well.

This is suitable for the case of forming the electrostatic discharge protection element isolated from the potential of the semiconductor substrate. In this triple-well structure, one well can also be extended in the second direction (pad arrangement direction) and used in common.

According to one embodiment of the invention, the impurity layer of the first electrostatic discharge protection element connected with the pad may be formed in a shape of a ring in plan view. When the impurity layer is not formed in the shape of a ring, the impurity layers are opposed in a small area, whereby a parasitic bipolar transistor may be turned ON. On the other hand, when forming the impurity layer in the shape of a ring to increase the opposing area, the base length of the parasitic bipolar transistor is increased, whereby a malfunction can be prevented.

According to another embodiment of the invention, the semiconductor integrated circuit may comprise a power supply protection element between the first and second power supply lines. An active element can be protected from static electricity by clamping a voltage between power supplies.

According to one embodiment of the invention, the semiconductor integrated circuit may comprise a RAM which stores data displayed on a display panel, and a data driver which drives a data line of the display panel based on output from the RAM. In this case, the pad is connected with an output line of the data driver. The RAM may include a bitline protection interconnect layer which protects a bitline, and the bitline protection interconnect layer may be connected with the second power supply line and the power supply protection element. Since a large number of power supply protection elements cannot be disposed, the interconnect impedance is increased when the distance from a ground terminal is large. However, the interconnect impedance can be reduced by providing the bitline protection interconnect layer.

According to one embodiment of the invention, each of the N pad rows may include M (M is an integer equal to or larger than two) pads, and (N×M) electrostatic discharge protection elements connected with the (N×M) pads may be provided in a lower layer of regions at least partially including each of the (N×M) pads.

According to this embodiment, the electrostatic discharge protection elements connected with the pads can be arranged with high degrees of freedom by utilizing the region in a lower layer of the pads in the pad arrangement direction in addition to the pad row direction.

According to one embodiment of the invention, each of the (N×M) electrostatic discharge protection elements may include a first electrostatic discharge protection element connected between a first power supply line and one of the (N×M) pads, and a second electrostatic discharge protection element connected between a second power supply line set at a potential lower than a potential of the first power supply line and one of the (N×M) pads. In this case, each of the pads may be formed in an approximately rectangular shape having a long side along the first direction and a short side along the second direction, and an impurity layer of each of the first and second electrostatic discharge protection elements may have a dimension in the second direction greater than a pad pitch in the second direction.

In this case, the degrees of freedom of the layout of the electrostatic discharge protection elements can be increased while reducing the interconnect impedance, thereby contributing to a reduction in the width of the semiconductor integrated circuit.

According to one embodiment of the invention, when the first and second electrostatic discharge protection elements adjacently disposed in the first direction make a pair, two pairs of the first and second electrostatic discharge protection elements may be mirror-image disposed with respect to an axis parallel to the second direction in a lower layer of each of the N pad rows.

This simplifies the mask design even when the number of pads is large, and can reduce the length of the interconnect between the pad and the electrostatic discharge protection element.

For example, outermost pads of the (N×M) pads in the second direction may be connected with the first and second electrostatic discharge protection elements positioned in a lower layer of the outermost pads, whereby the length of the interconnect can be minimized.

According to one embodiment of the invention, the semiconductor integrated circuit may comprise a scan driver which drives a scan line of a display panel, wherein the pad may be connected with an output line of the scan driver.

According to one embodiment of the invention, the pads may be arranged at an equal pitch along the second direction in each of the N pad rows, and two rows of the pads adjacent in the first direction may be shifted in the second direction by a half pitch of the equal pitch. This arrangement is a so-called staggered arrangement. The layout of the electrostatic discharge protection elements, the pads, and the interconnects is facilitated by shifting the pad position at a half pitch in each row.

Another embodiment of the invention defines an electronic instrument comprising the above semiconductor integrated circuit.

Preferred embodiments of the invention are described below in detail. Note that the embodiments described below do not in any way limit the scope of the invention defined by the claims laid out herein. Note that all elements of the embodiments described below should not necessarily be taken as essential requirements for the invention.

1. Comparative Example

FIG. 1A shows an integrated circuit device 500 which is a comparative example of one embodiment of the invention. The integrated circuit device 500 shown in FIG. 1A includes a memory block MB (display data RAM) and a data driver block DB. The memory block MB and the data driver block DB are disposed along a direction D2. The memory block MB and the data driver block DB are ultra-flat blocks of which the length along a direction D1 is longer than the width in the direction D2.

Image data supplied from a host is written into the memory block MB. The data driver block DB converts the digital image data written into the memory block MB into an analog data voltage, and drives data lines of a display panel. In FIG. 1A, the image data signal flows in the direction D2. Therefore, in the comparative example shown in FIG. 1A, the memory block MB and the data driver block DB are disposed along the direction D2 corresponding to the signal flow. This reduces the path between the input and the output so that a signal delay can be optimized, whereby an efficient signal transmission can be achieved.

However, the comparative example shown in FIG. 1A has the following problems.

Figure 2A:
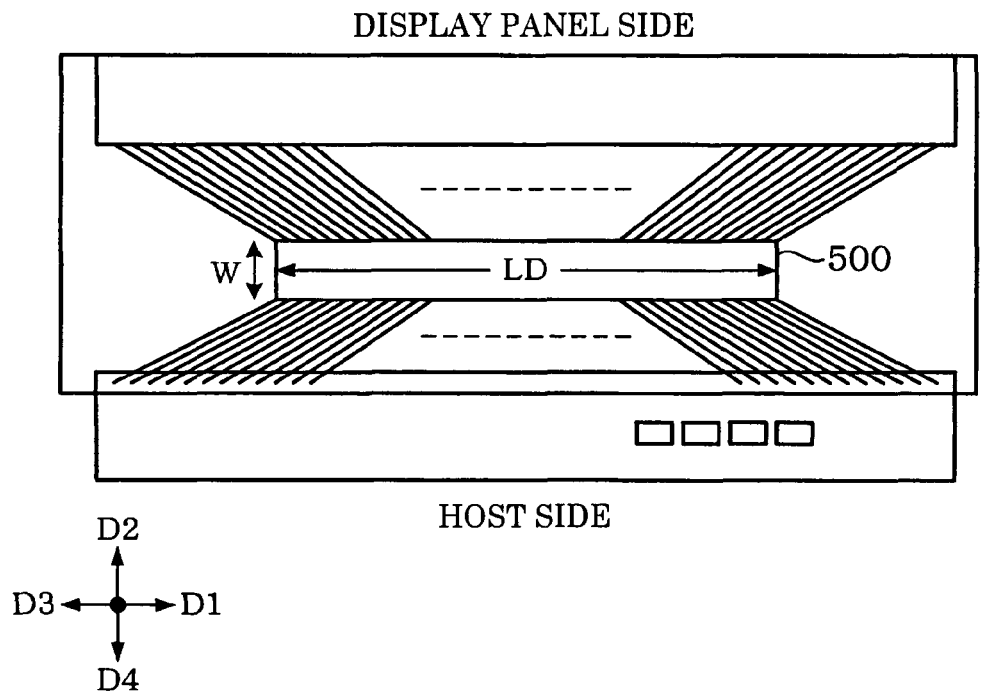
FIGS. 2A and 2B are illustrative of mounting of an integrated circuit device.

First, a reduction in the chip size is required for an integrated circuit device such as a display driver in order to reduce cost. However, if the chip size is reduced by merely shrinking the integrated circuit device 500 by using a microfabrication technology, the size of the integrated circuit device 500 is reduced not only in the short side direction but also in the long side direction. Therefore, it becomes difficult to mount the integrated circuit device 500 as shown in FIG. 2A. Specifically, it is desirable that the output pitch be 22 μm or more, for example. However, the output pitch is reduced to 17 μm by merely shrinking the integrated circuit device 500 as shown in FIG. 2A, for example, whereby it becomes difficult to mount the integrated circuit device 500 due to the narrow pitch. Moreover, the number of glass substrates obtained is decreased due to an increase in the glass frame of the display panel, whereby cost is increased.

Figure 1B:
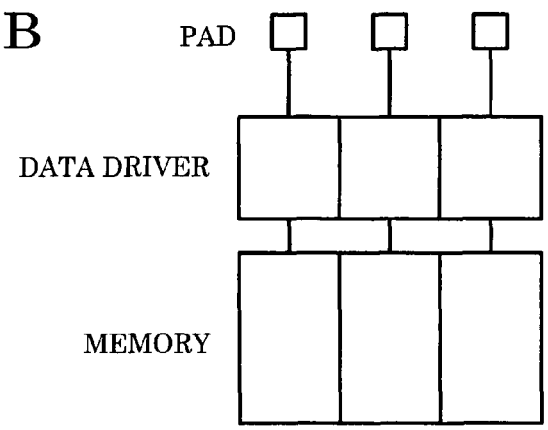
Figure 1C:
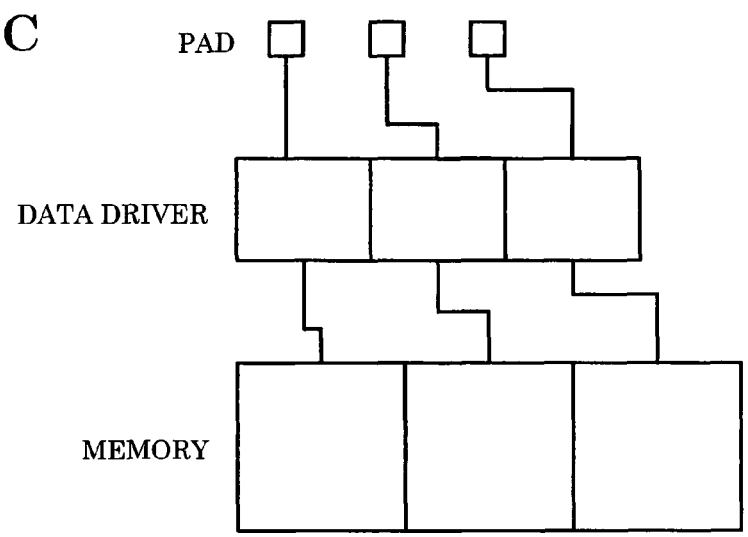

Second, the configurations of the memory and the data driver of the display driver are changed corresponding to the type of display panel (amorphous TFT or low-temperature polysilicon TFT), the number of pixels (QCIF, QVGA, or VGA), the specification of the product, and the like. Therefore, in the comparative example shown in FIG. 1A, even if the pad pitch, the cell pitch of the memory, and the cell pitch of the data driver coincide in one product as shown in FIG. 1B, the pitches do not coincide as shown in FIG. 1C when the configurations of the memory and the data driver are changed. If the pitches do not coincide as shown in FIG. 1C, an unnecessary wiring region for absorbing the pitch difference must be formed between the circuit blocks. In particular, in the comparative example shown in FIG. 1A in which the block is made flat in the direction D1, the area of an unnecessary wiring region for absorbing the pitch difference is increased. As a result, the width W of the integrated circuit device 500 in the direction D2 is increased, whereby cost is increased due to an increase in the chip area.

If the layout of the memory and the data driver is changed so that the pad pitch coincides with the cell pitch in order to avoid such a problem, the development period is increased, whereby cost is increased. Specifically, since the circuit configuration and the layout of each circuit block are individually designed and the pitch is adjusted thereafter in the comparative example shown in FIG. 1A, unnecessary area is provided or the design becomes inefficient.

2. Configuration of Integrated Circuit Device

FIG. 3 shows a configuration example of an integrated circuit device 10 according to one embodiment of the invention which can solve the above-described problems. In this embodiment, the direction from a first side SD1 (short side) of the integrated circuit device 10 toward a third side SD3 opposite to the first side SD1 is defined as a direction D1, and the direction opposite to the first direction D1 is defined as a direction D3. The direction from a second side SD2 (long side) of the integrated circuit device 10 toward a fourth side SD4 opposite to the second side SD2 is defined as a direction D2, and the direction opposite to the second direction D2 is defined as a direction D4. In FIG. 3, the left side of the integrated circuit device 10 is the first side SD1, and the right side is the third side SD3. However, the left side may be the third side SD3, and the right side may be the first side SD1.

As shown in FIG. 3, the integrated circuit device 10 according to this embodiment includes first to Nth circuit blocks CB1 to CBN (N is an integer larger than one) disposed along the direction D1. Specifically, while the circuit blocks are arranged in the direction D2 in the comparative example shown in FIG. 1A, the circuit blocks CB1 to CBN are arranged in the direction D1 in this embodiment. Each circuit block is a relatively square block differing from the ultra-flat block as in the comparative example shown in FIG. 1A.

The integrated circuit device 10 includes an output-side I/F region 12 (first interface region in a broad sense) provided along the side SD4 and on the D2 side of the first to Nth circuit blocks CB1 to CBN. The integrated circuit device 10 includes an input-side I/F region 14 (second interface region in a broad sense) provided along the side SD2 and on the D4 side of the first to Nth circuit blocks CB1 to CBN. In more detail, the output-side I/F region 12 (first I/O region) is disposed on the D2 side of the circuit blocks CB1 to CBN without other circuit blocks interposed therebetween, for example. The input-side I/F region 14 (second I/O region) is disposed on the D4 side of the circuit blocks CB1 to CBN without other circuit blocks interposed therebetween, for example. Specifically, only one circuit block (data driver block) exists in the direction D2 at least in the area in which the data driver block exists. When the integrated circuit device 10 is used as an intellectual property (IP) core and incorporated in another integrated circuit device, the integrated circuit device 10 may be configured to exclude at least one of the I/F regions 12 and 14.

The output-side (display panel side) I/F region 12 is a region which serves as an interface between the integrated circuit device 10 and the display panel, and includes pads and various elements such as output transistors and protective elements connected with the pads. In more detail, the output-side I/F region 12 includes output transistors for outputting data signals to data lines and scan signals to scan lines, for example. When the display panel is a touch panel, the output-side I/F region 12 may include input transistors.

The input-side (host side) I/F region 14 is a region which serves as an interface between the integrated circuit device 10 and a host (MPU, image processing controller, or baseband engine), and may include pads and various elements connected with the pads, such as input (input-output) transistors, output transistors, and protective elements. In more detail, the input-side I/F region 14 includes input transistors for inputting signals (digital signals) from the host, output transistors for outputting signals to the host, and the like.

An output-side or input-side I/F region may be provided along the short side SD1 or SD3. Bumps which serve as external connection terminals may be provided in the I/F (interface) regions 12 and 14, or may be provided in other regions (first to Nth circuit blocks CB1 to CBN). When providing the bumps in the region other than the I/F regions 12 and 14, the bumps are formed by using a small bump technology (e.g. bump technology using resin core) other than a gold bump technology.

The first to Nth circuit blocks CB1 to CBN may include at least two (or three) different circuit blocks (circuit blocks having different functions). Taking an example in which the integrated circuit device 10 is a display driver, the circuit blocks CB1 to CBN may include at least two of a data driver block, a memory block, a scan driver block, a logic circuit block, a grayscale voltage generation circuit block, and a power supply circuit block. In more detail, the circuit blocks CB1 to CBN may include at least a data driver block and a logic circuit block, and may further include a grayscale voltage generation circuit block. When the integrated circuit device 10 includes a built-in memory, the circuit blocks CB1 to CBN may further include a memory block.

FIG. 4 shows an example of various types of display drivers and circuit blocks provided in the display drivers. In an amorphous thin film transistor (TFT) panel display driver including a built-in memory (RAM), the circuit blocks CB1 to CBN include a memory block, a data driver (source driver) block, a scan driver (gate driver) block, a logic circuit (gate array circuit) block, a grayscale voltage generation circuit (γ-correction circuit) block, and a power supply circuit block. In a low-temperature polysilicon (LTPS) TFT panel display driver including a built-in memory, since the scan driver can be formed on a glass substrate, the scan driver block may be omitted. The memory block may be omitted in an amorphous TFT panel display driver which does not include a memory, and the memory block and the scan driver block may be omitted in a low-temperature polysilicon TFT panel display driver which does not include a memory. In a color super twisted nematic (CSTN) panel display driver and a thin film diode (TFD) panel display driver, the grayscale voltage generation circuit block may be omitted.

FIGS. 5A and 5B show examples of a planar layout of the integrated circuit device 10 as the display driver according to this embodiment. FIGS. 5A and 5B are examples of an amorphous TFT panel display driver including a built-in memory. FIG. 5A shows a QCIF and 32-grayscale display driver, and FIG. 5B shows a QVGA and 64-grayscale display driver.

In FIGS. 5A and 5B, the first to Nth circuit blocks CB1 to CBN include first to fourth memory blocks MB1 to MB4 (first to Ith memory blocks in a broad sense; I is an integer larger than one). The first to Nth circuit blocks CB1 to CBN include first to fourth data driver blocks DB1 to DB4 (first to Ith data driver blocks in a broad sense) respectively disposed adjacent to the first to fourth memory blocks MB1 to MB4 along the direction D1. In more detail, the memory block MB1 and the data driver block DB1 are disposed adjacent to each other along the direction D1, and the memory block MB2 and the data driver block DB2 are disposed adjacent to each other along the direction D1. The memory block MB1 adjacent to the data driver block DB1 stores image data (display data) used by the data driver block DB1 to drive the data line, and the memory block MB2 adjacent to the data driver block DB2 stores image data used by the data driver block DB2 to drive the data line.

In FIG. 5A, the data driver block DB1 (Jth data driver block in a broad sense; $1 \leq J < I$) of the data driver blocks DB1 to DB4 is disposed adjacently on the D3 side of the memory block MB1 (Jth memory block in a broad sense) of the memory blocks MB1 to MB4. The memory block MB2 ((J+1)th memory block in a broad sense) is disposed adjacently on the D1 side of the memory block MB1. The data driver block DB2 ((J+1)th data driver block in a broad sense) is disposed adjacently on the D1 side of the memory block MB2. The arrangement of the memory blocks MB3 and MB4 and the data driver blocks DB3 and DB4 is the same as described above. In FIG. 5A, the memory block MB1 and the data driver block DB1 and the memory block MB2 and the data driver block DB2 are disposed line-symmetrical with respect to the borderline between the memory blocks MB1 and MB2, and the memory block MB3 and the data driver block DB3 and the memory block MB4 and the data driver block DB4 are disposed line-symmetrical with respect to the borderline between the memory blocks MB3 and MB4. In FIG. 5A, the data driver blocks DB2 and DB3 are disposed adjacent to each other. However, another circuit block may be disposed between the data driver blocks DB2 and DB3.

In FIG. 5B, the data driver block DB1 (Jth data driver block) of the data driver blocks DB1 to DB4 is disposed adjacently on the D3 side of the memory block MB1 (Jth memory block) of the memory blocks MB1 to MB4. The data driver block DB2 ((J+1)th data driver block) is disposed on the D1 side of the memory block MB1. The memory block MB2 ((J+1)th memory block) is disposed on the D1 side of the data driver block DB2. The data driver block DB3, the memory block MB3, the data driver block DB4, and the memory block MB4 are disposed in the same manner as described above. In FIG. 5B, the memory block MB1 and the data driver block DB2, the memory block MB2 and the data driver block DB3, and the memory block MB3 and the data driver block DB4 are respectively disposed adjacent to each other. However, another circuit block may be disposed between these blocks.

The layout arrangement shown in FIG. 5A has an advantage in that a column address decoder can be used in common between the memory blocks MB1 and MB2 or the memory blocks MB3 and MB4 (between the Jth and (J+1)th memory blocks). The layout arrangement shown in FIG. 5B has an advantage in that the wiring pitch of the data signal output lines from the data driver blocks DB1 to DB4 to the output-side I/F region 12 can be equalized so that the wiring efficiency can be increased.

The layout arrangement of the integrated circuit device 10 according to this embodiment is not limited to those shown in FIGS. 5A and 5B. For example, the number of memory blocks and data driver blocks may be set at 2, 3, or 5 or more, or the memory block and the data driver block may not be divided into blocks. A modification in which the memory block is not disposed adjacent to the data driver block is also possible. A configuration is also possible in which the memory block, the scan driver block, the power supply circuit block, or the grayscale voltage generation circuit block is not provided. A circuit block having a width significantly small in the direction D2 (narrow circuit block having a width less than the width WB) may be provided between the circuit blocks CB1 to CBN and the output-side I/F region 12 or the input-side I/F region 14. The circuit blocks CB1 to CBN may include a circuit block in which different circuit blocks are arranged in stages in the direction D2. For example, the scan driver circuit and the power supply circuit may be formed in one circuit block.

Figure 6A:
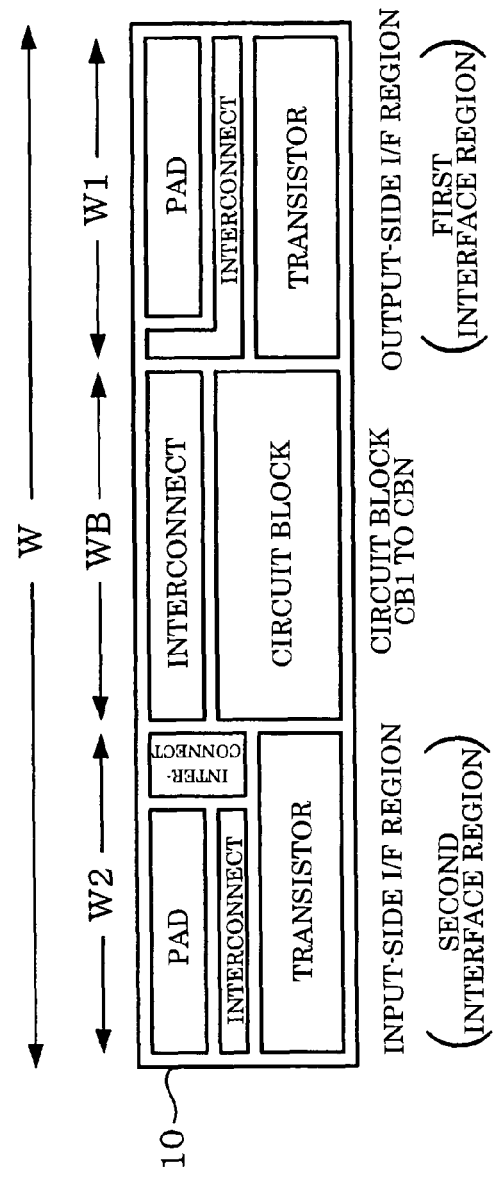
FIGS. 6A and 6B are examples of cross-sectional views of the integrated circuit device.
Figure 6B:
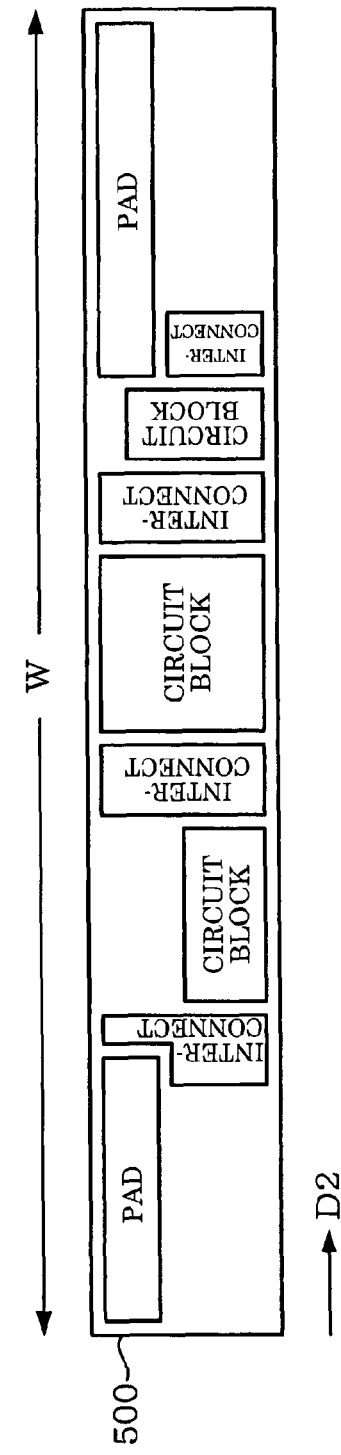

FIG. 6A shows an example of a cross-sectional view of the integrated circuit device 10 according to this embodiment along the direction D2. In the comparative example shown in FIG. 1A, two or more circuit blocks are disposed along the direction D2 as shown in FIG. 6B. Moreover, wiring regions are formed between the circuit blocks and between the circuit blocks and the I/F region in the direction D2. Therefore, since the width W of the integrated circuit device 500 in the direction D2 (short side direction) is increased, a slim chip cannot be realized. Therefore, even if the chip is shrunk by using a macrofabrication technology, the length LD in the direction D1 (long side direction) is decreased, as shown in FIG. 2A, so that the output pitch becomes narrow, whereby it becomes difficult to mount the integrated circuit device 500.

Figure 2B:
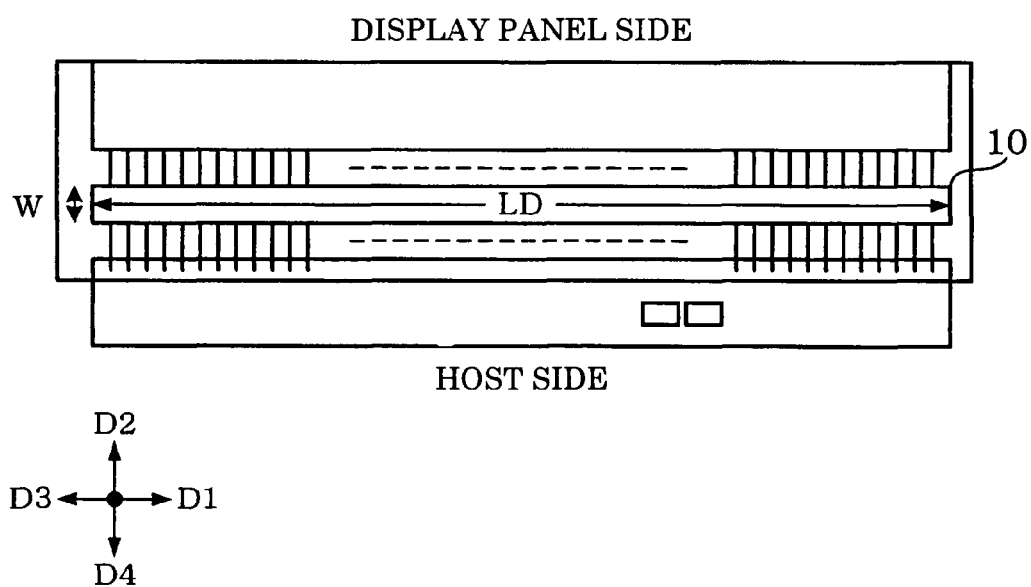

In this embodiment, the circuit blocks CB1 to CBN are disposed along the direction D1 as shown in FIGS. 3, 5A, and 5B. As shown in FIG. 6A, the transistor (circuit element) can be disposed under the pad (bump) (active surface bump). Moreover, the signal lines can be formed between the circuit blocks and between the circuit blocks and the I/F using global lines formed in the upper layer (lower layer of the pad) of local lines in the circuit blocks. Therefore, since the width W of the integrated circuit device 10 in the direction D2 can be reduced while maintaining the length LD of the integrated circuit device 10 in the direction D1 as shown in FIG. 2B, a very slim chip can be realized. As a result, since the output pitch can be maintained at 22 μm or more, for example, mounting can be facilitated.

In this embodiment, since the circuit blocks CB1 to CBN are disposed along the direction D1, it is possible to easily deal with a change in the product specifications and the like. Specifically, since product of various specifications can be designed by using a common platform, the design efficiency can be increased. For example, when the number of pixels or the number of grayscales of the display panel is increased or decreased in FIGS. 5A and 5B, it is possible to deal with such a situation merely by increasing or decreasing the number of blocks of memory blocks or data driver blocks, the number of readings of image data in one horizontal scan period, or the like. FIGS. 5A and 5B show an example of an amorphous TFT panel display driver including a memory. When developing a low-temperature polysilicon TFT panel product including a memory, it suffices to remove the scan driver block from the circuit blocks CB1 to CBN. When developing a product which does not include a memory, it suffices to remove the memory block from the circuit blocks CB1 to CBN. In this embodiment, even if the circuit block is removed corresponding to the specification, since the effect on the remaining circuit blocks is minimized, the design efficiency can be increased.

In this embodiment, the widths (heights) of the circuit blocks CB1 to CBN in the direction D2 can be uniformly adjusted to the width (height) of the data driver block or the memory block, for example. Since it is possible to deal with an increase or decrease in the number of transistors of each circuit block by increasing or decreasing the length of each circuit block in the direction D1, the design efficiency can be further increased. For example, when the number of transistors is increased or decreased in FIGS. 5A and 5B due to a change in the configuration of the grayscale voltage generation circuit block or the power supply circuit block, it is possible to deal with such a situation by increasing or decreasing the length of the grayscale voltage generation circuit block or the power supply circuit block in the direction D1.

As a second comparative example, a narrow data driver block may be disposed in the direction D1, and other circuit blocks such as the memory block may be disposed along the direction D1 on the D4 side of the data driver block, for example. However, in the second comparative example, since the data driver block having a large width lies between other circuit blocks such as the memory block and the output-side I/F region, the width W of the integrated circuit device in the direction D2 is increased, so that it is difficult to realize a slim chip. Moreover, an additional wiring region is formed between the data driver block and the memory block, whereby the width W is further increased. Furthermore, when the configuration of the data driver block or the memory block is changed, the pitch difference described with reference to FIGS. 1B and 1C occurs, whereby the design efficiency cannot be increased.

As a third comparative example of this embodiment, only circuit blocks (e.g. data driver blocks) having the same function may be divided and arranged in the direction D1. However, since the integrated circuit device can be provided with only a single function (e.g. function of the data driver) in the third comparative example, development of various products cannot be realized. In this embodiment, the circuit blocks CB1 to CBN include circuit blocks having at least two different functions. Therefore, various integrated circuit devices corresponding to various types of display panels can be provided as shown in FIGS. 4, 5A, and 5B.

3. Circuit Configuration

Figure 7:
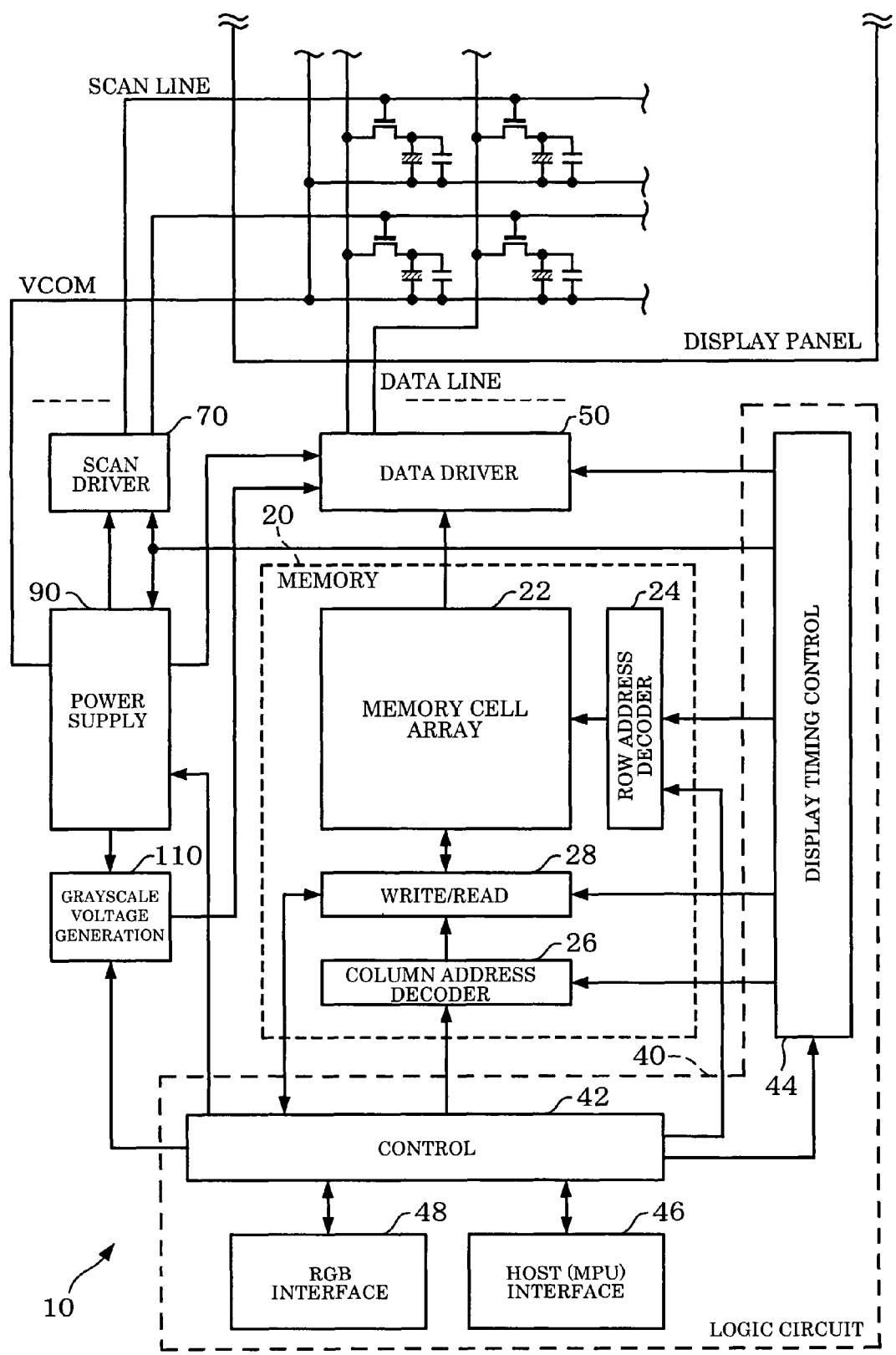
FIG. 7 is a circuit configuration example of the integrated circuit device.

FIG. 7 shows a circuit configuration example of the integrated circuit device 10. The circuit configuration of the integrated circuit device 10 is not limited to the circuit configuration shown in FIG. 7. Various modifications and variations may be made. A memory 20 (display data RAM) stores image data. A memory cell array 22 includes a plurality of memory cells, and stores image data (display data) for at least one frame (one screen). In this case, one pixel is made up of R, G, and B subpixels (three dots), and 6-bit (k-bit) image data is stored for each subpixel, for example. A row address decoder 24 (MPU/LCD row address decoder) decodes a row address and selects a wordline of the memory cell array 22. A column address decoder 26 (MPU column address decoder) decodes a column address and selects a bitline of the memory cell array 22. A write/read circuit 28 (MPU write/read circuit) writes image data into the memory cell array 22 or reads image data from the memory cell array 22. An access region of the memory cell array 22 is defined by a rectangle having a start address and an end address as opposite vertices. Specifically, the access region is defined by the column address and the row address of the start address and the column address and the row address of the end address so that memory access is performed.

A logic circuit 40 (e.g. automatic placement and routing circuit) generates a control signal for controlling display timing, a control signal for controlling data processing timing, and the like. The logic circuit 40 may be formed by automatic placement and routing such as a gate array (G/A). A control circuit 42 generates various control signals and controls the entire device. In more detail, the control circuit 42 outputs grayscale characteristic (γ-characteristic) adjustment data (γ-correction data) to a grayscale voltage generation circuit 110 and controls voltage generation of a power supply circuit 90. The control circuit 42 controls write/read processing for the memory using the row address decoder 24, the column address decoder 26, and the write/read circuit 28. A display timing control circuit 44 generates various control signals for controlling display timing, and controls reading of image data from the memory into the display panel. A host (MPU) interface circuit 46 realizes a host interface which accesses the memory by generating an internal pulse each time accessed by the host. An RGB interface circuit 48 realizes an RGB interface which writes motion picture RGB data into the memory based on a dot clock signal. The integrated circuit device 10 may be configured to include only one of the host interface circuit 46 and the RGB interface circuit 48.

In FIG. 7, the host interface circuit 46 and the RGB interface circuit 48 access the memory 20 in pixel units. Image data designated by a line address and read in line units is supplied to a data driver 50 in line cycle at an internal display timing independent of the host interface circuit 46 and the RGB interface circuit 48.

Figure 8A:
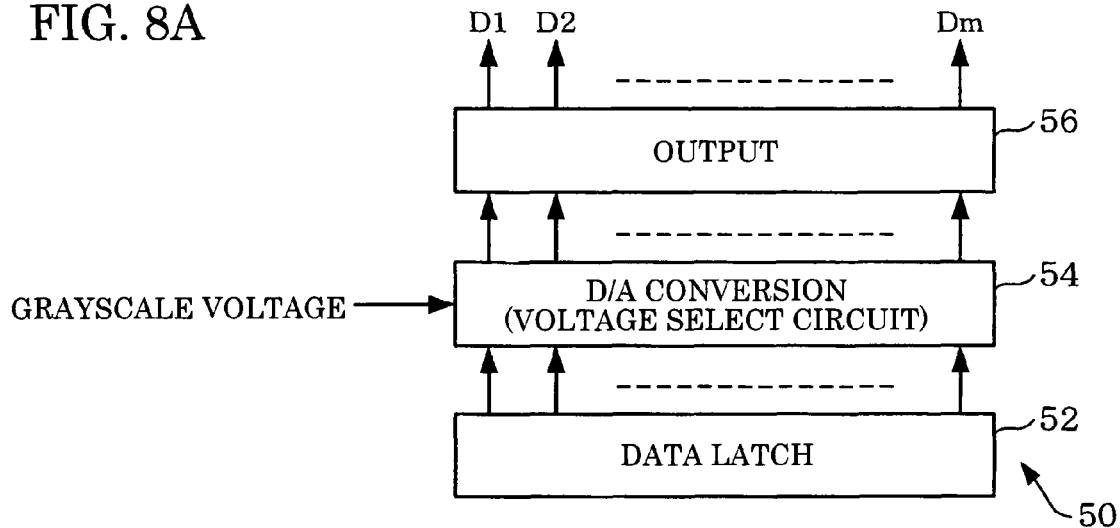
FIGS. 8A, 8B, and 8C are illustrative of configuration examples of a data driver and a scan driver.

The data driver 50 is a circuit for driving a data line of the display panel. FIG. 8A shows a configuration example of the data driver 50. A data latch circuit 52 latches the digital image data from the memory 20. A D/A conversion circuit 54 (voltage select circuit) performs D/A conversion of the digital image data latched by the data latch circuit 52, and generates an analog data voltage. In more detail, the D/A conversion circuit 54 receives a plurality of (e.g. 64 stages) grayscale voltages (reference voltages) from the grayscale voltage generation circuit 110, selects a voltage corresponding to the digital image data from the grayscale voltages, and outputs the selected voltage as the data voltage. An output circuit 56 (driver circuit or buffer circuit) buffers the data voltage from the D/A conversion circuit 54, and outputs the data voltage to the data line of the display panel to drive the data line. A part of the output circuit 56 (e.g. output stage of operational amplifier) may not be included in the data driver 50 and may be disposed in other region.

Figure 8B:
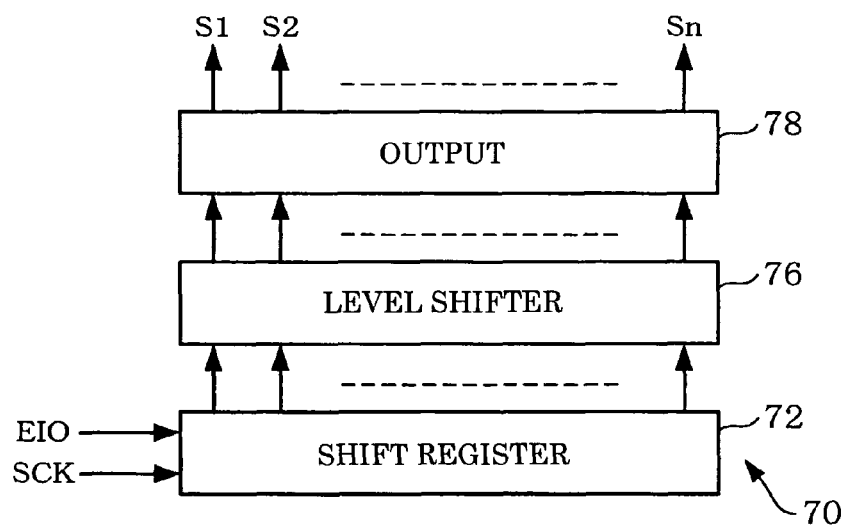
Figure 8C:
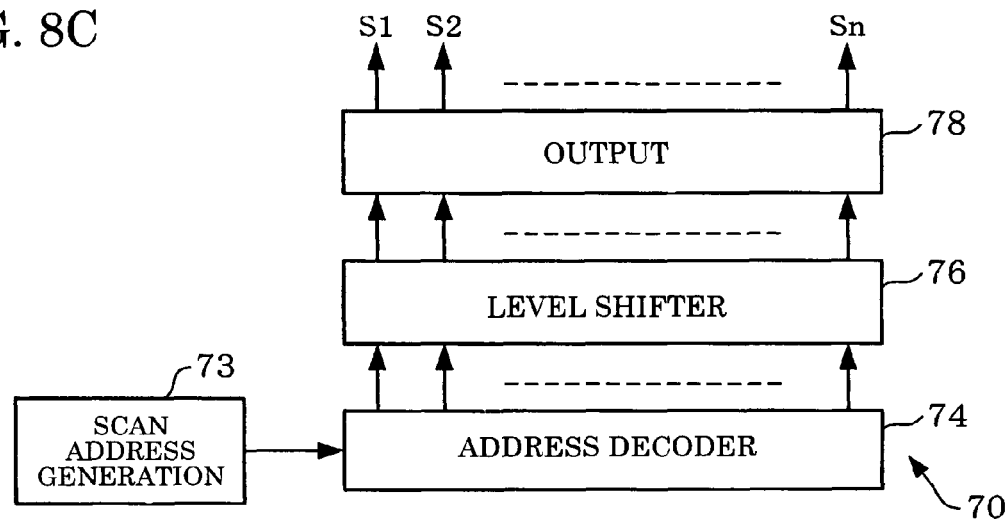

A scan driver 70 is a circuit for driving a scan line of the display panel. FIG. 8B shows a configuration example of the scan driver 70. A shift register 72 includes a plurality of sequentially connected flip-flops, and sequentially shifts an enable input-output signal EIO in synchronization with a shift clock signal SCK. A level shifter 76 converts the voltage level of the signal from the shift register 72 into a high voltage level for selecting the scan line. An output circuit 78 buffers a scan voltage converted and output by the level shifter 76, and outputs the scan voltage to the scan line of the display panel to drive the scan line. The scan driver 70 may be configured as shown in FIG. 8C. In FIG. 8C, a scan address generation circuit 73 generates and outputs a scan address, and an address decoder decodes the scan address. The scan voltage is output to the scan line specified by the decode processing through the level shifter 76 and the output circuit 78.

Figure 9A:
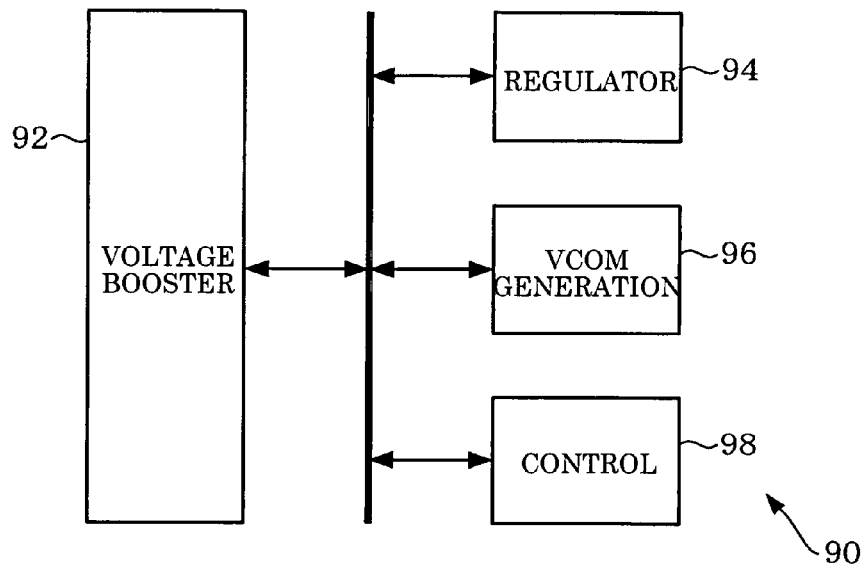
FIGS. 9A and 9B are configuration examples of a power supply circuit and a grayscale voltage generation circuit.

The power supply circuit 90 is a circuit which generates various power supply voltages. FIG. 9A shows a configuration example of the power supply circuit 90. A voltage booster circuit 92 is a circuit which generates a boosted voltage by boosting an input power source voltage or an internal power supply voltage by a charge-pump method using a boost capacitor and a boost transistor, and may include first to fourth voltage booster circuits and the like. A high voltage used by the scan driver 70 and the grayscale voltage generation circuit 110 can be generated by the voltage booster circuit 92. A regulator circuit 94 regulates the level of the boosted voltage generated by the voltage booster circuit 92. A VCOM generation circuit 96 generates and outputs a voltage VCOM supplied to a common electrode of the display panel. A control circuit 98 controls the power supply circuit 90, and includes various control registers and the like.

Figure 9B:
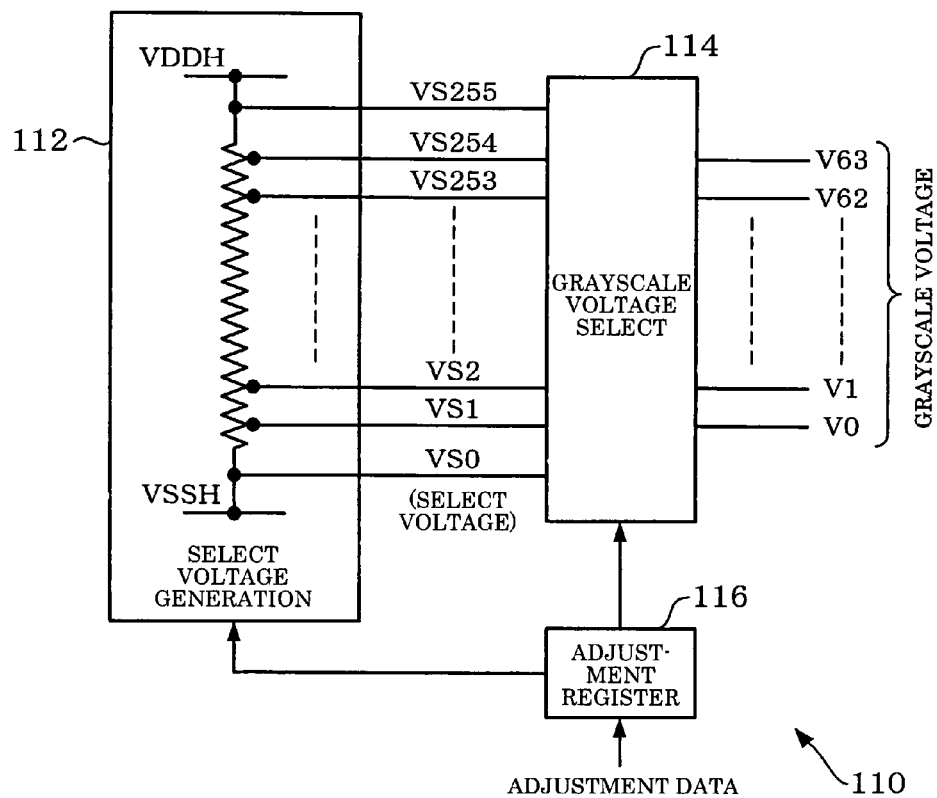

The grayscale voltage generation circuit 110 (γ-correction circuit) is a circuit which generates grayscale voltages. FIG. 9B shows a configuration example of the grayscale voltage generation circuit 110. A select voltage generation circuit 112 (voltage divider circuit) outputs select voltages VS0 to VS255 (R select voltages in a broad sense) based on high-voltage power supply voltages VDDH and VSSH generated by the power supply circuit 90. In more detail, the select voltage generation circuit 112 includes a ladder resistor circuit including a plurality of resistor elements connected in series. The select voltage generation circuit 112 outputs voltages obtained by dividing the power supply voltages VDDH and VSSH using the ladder resistor circuit as the select voltages VS0 to VS255. A grayscale voltage select circuit 114 selects 64 (S in a broad sense; R>S) voltages from the select voltages VS0 to VS255 in the case of using 64 grayscales based on the grayscale characteristic adjustment data set in an adjustment register 116 by the logic circuit 40, and outputs the selected voltages as grayscale voltages V0 to V63. This enables generation of a grayscale voltage having grayscale characteristics (γ-correction characteristics) optimum for the display panel. In the case of performing a polarity reversal drive, a positive ladder resistor circuit and a negative ladder resistor circuit may be provided in the select voltage generation circuit 112. The resistance value of each resistor element of the ladder resistor circuit may be changed based on the adjustment data set in the adjustment register 116. An impedance conversion circuit (voltage-follower-connected operational amplifier) may be provided in the select voltage generation circuit 112 or the grayscale voltage select circuit 114.

Figure 10A:
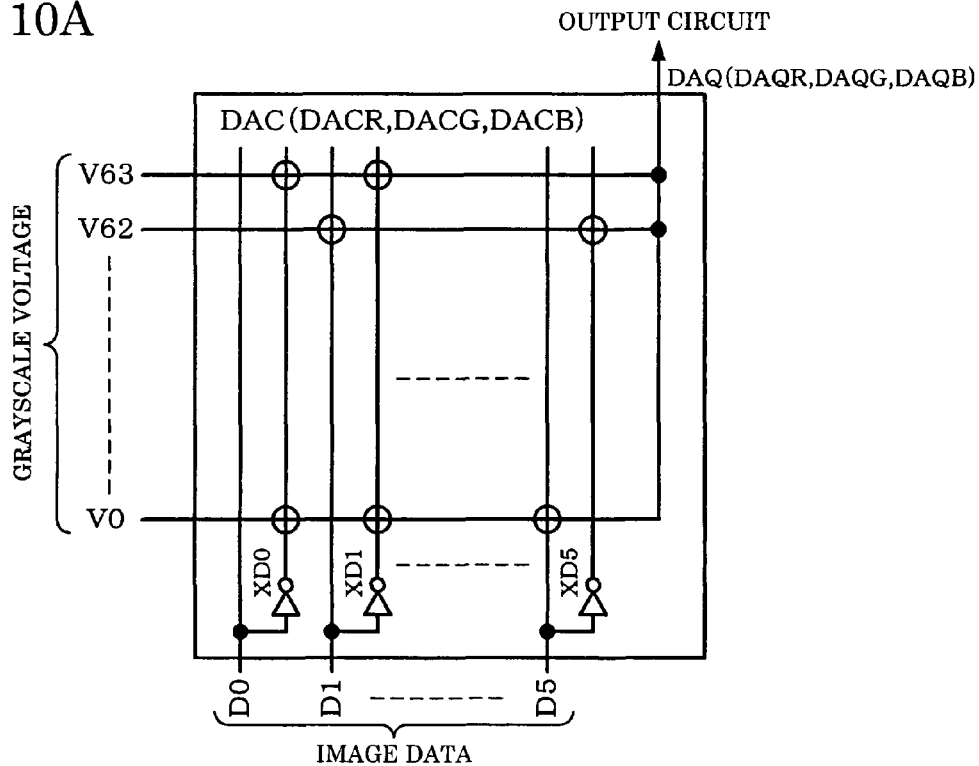
FIGS. 10A, 10B, and 10C are configuration examples of a D/A conversion circuit and an output circuit.

FIG. 10A shows a configuration example of a digital-analog converter (DAC) included in the D/A conversion circuit 54 shown in FIG. 8A. The DAC shown in FIG. 10A may be provided in subpixel units (or pixel units), and may be formed by a ROM decoder and the like. The DAC selects one of the grayscale voltages V0 to V63 from the grayscale voltage generation circuit 110 based on 6-bit digital image data D0 to D5 and inverted data XD0 to XD5 from the memory 20 to convert the image data D0 to D5 into an analog voltage. The DAC outputs the resulting analog voltage signal DAQ (DAQR, DAQG, DAQB) to the output circuit 56.

When R, G, and B data signals are multiplexed and supplied to a low-temperature polysilicon TFT display driver or the like (FIG. 10C), R, G, and B image data may be D/A converted by using one common DAC. In this case, the DAC shown in FIG. 10A is provided in pixel units.

Figure 10B:
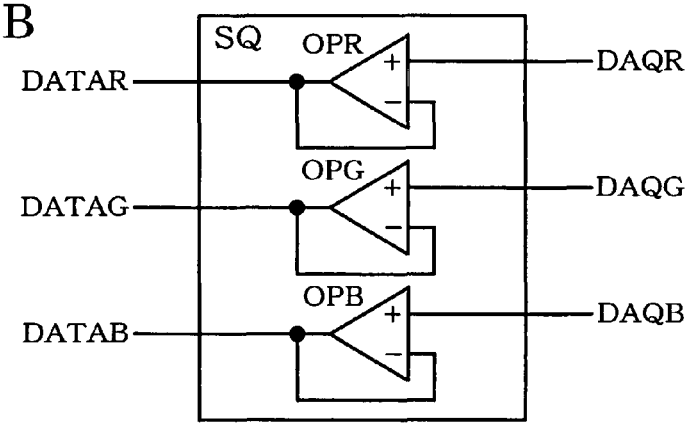
Figure 10C:
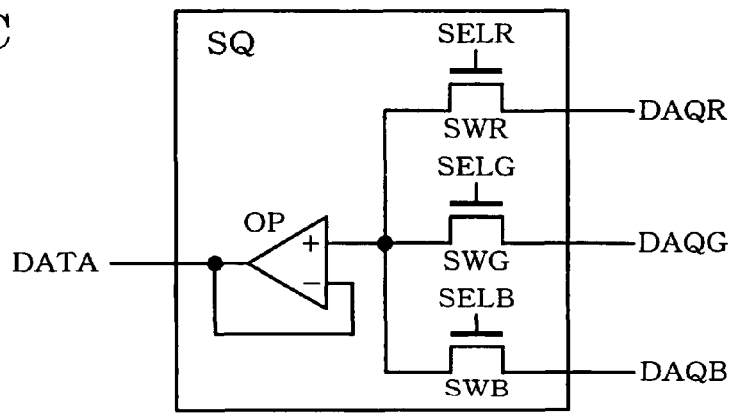

FIG. 10B shows a configuration example of an output section SQ included in the output circuit 56 shown in FIG. 8A. The output section SQ shown in FIG. 10B may be provided in pixel units. The output section SQ includes R (red), G (green), and B (blue) impedance conversion circuits OPR, OPG, and OPB (voltage-follower-connected operational amplifiers), performs impedance conversion of the signals DAQR, DAQG, and DAQB from the DAC, and outputs data signals DATAR, DATAG, and DATAB to R, G, and B data signal output lines. When using a low-temperature polysilicon TFT panel, switch elements (switch transistors) SWR, SWG, and SWB as shown in FIG. 10C may be provided, and the impedance conversion circuit OP may output a data signal DATA in which the R, Q and B data signals are multiplexed. The data signals may be multiplexed over a plurality of pixels. Only the switch elements and the like may be provided in the output section SQ without providing the impedance conversion circuit as shown in FIGS. 10B and 10C.

4. Width of Integrated Circuit Device

4.1 Arrangement Relationship Between Pad and Electrostatic Discharge Protection Element In this embodiment, the width of the integrated circuit device 10 in the direction D2 can be further reduced by disposing an electrostatic discharge protection element connected with a pad provided in the interface region (e.g. output-side interface region 12) of the integrated circuit device 10 in a lower layer of the pad. When disposing a transistor and a resistor element in a lower layer of the pad in addition to the electrostatic discharge protection element, the width W of the integrated circuit device 10 in the direction D2 can be further reduced by appropriately arranging these elements.

FIG. 11 shows an electrostatic discharge protection circuit for a pad 200 provided in the output-side interface region 12. A P-type transistor 210 is connected between an output line 202 connected with the pad 200 and a high-potential-side first power supply line 204. An N-type transistor 212 is connected between the output line 202 and a low-potential-side second power supply line 206.

The function of the electrostatic discharge protection element is to protect the P-type and N-type transistors 210 and 212 from static electricity applied to the pad 200.

As the electrostatic discharge protection element, a first electrostatic discharge protection element such as a first diode DI1 is reverse-connected between the first power supply line 204 and the output line 202. Likewise, a second electrostatic discharge protection element such as a second diode DI2 is reverse-connected between the output line 202 and the second power supply line 206. This embodiment illustrates the arrangement of the first and second electrostatic discharge protection elements DI1 and DI2. A power supply protection element 208 is connected between the first and second power supply lines 204 and 206. When a high voltage equal to or higher than a specific voltage is applied between the first and second power supply lines 204 and 206, the power supply protection element 208 clamps the voltage at a specific voltage value. As the power supply protection element 208, a bipolar transistor, a thyristor, an element formed by reverse-connecting a plurality of diodes in series, or the like may be used.

This embodiment further reduces the width of the integrated circuit device 10 in the direction D2 by disposing the first and second electrostatic discharge protection elements DI1 and DI2 in a lower layer of the pad 200.

4.2 Output Pad and Electrostatic Discharge Protection Element of Data Driver In FIG. 12, the memory block MB, the data driver block DB, and an output pad region PDB of the data driver block DB of the integrated circuit device 10 shown in FIG. 5B are integrated into a macrocell. Note that this embodiment may also be applied to a device which is not integrated into a macrocell.

In FIG. 12, the output pad region PDB includes N (N is an integer equal to or larger than two) pad rows such as first and second pad rows 220 and 222 (i.e. N=2). The first and second pad rows 220 and 222 are disposed at an interval in the direction D4 (first direction in a broad sense), and a plurality of pads 200 (pads 200A in the first pad row 220 and pads 200B in the second pad row 222) are arranged at intervals at an equal pitch in the direction D1 (second direction in a broad sense) perpendicular to the direction D4. In FIG. 12, the pads 200A and 200B in the first and second pad rows 220 and 222 are disposed in a staggered arrangement in which the pads 200A and 200B are shifted by a half pitch in the direction D4 instead of being disposed linearly in the direction D4. The pads 200A and 200B in the first and second pad rows 220 and 222 may be disposed linearly in the direction D4. However, when the pitch is constant, it is advantageous to employ the staggered arrangement in order to enlarge the electrostatic discharge protection element formation region in the direction D1.

The integrated circuit device 10 according to this embodiment includes five interconnect layers. These interconnect layers are referred to as layers ALA, ALB, ALC, ALD, and ALE in the order from the lowermost layer. The fifth metal layer ALE is used as the pads 200 (see FIG. 6A) and an interconnect layer between the blocks shown in FIGS. 5A and 5B. The elements in each block are interconnected using the fourth layer ALD and the lower layers.

Figure 13:
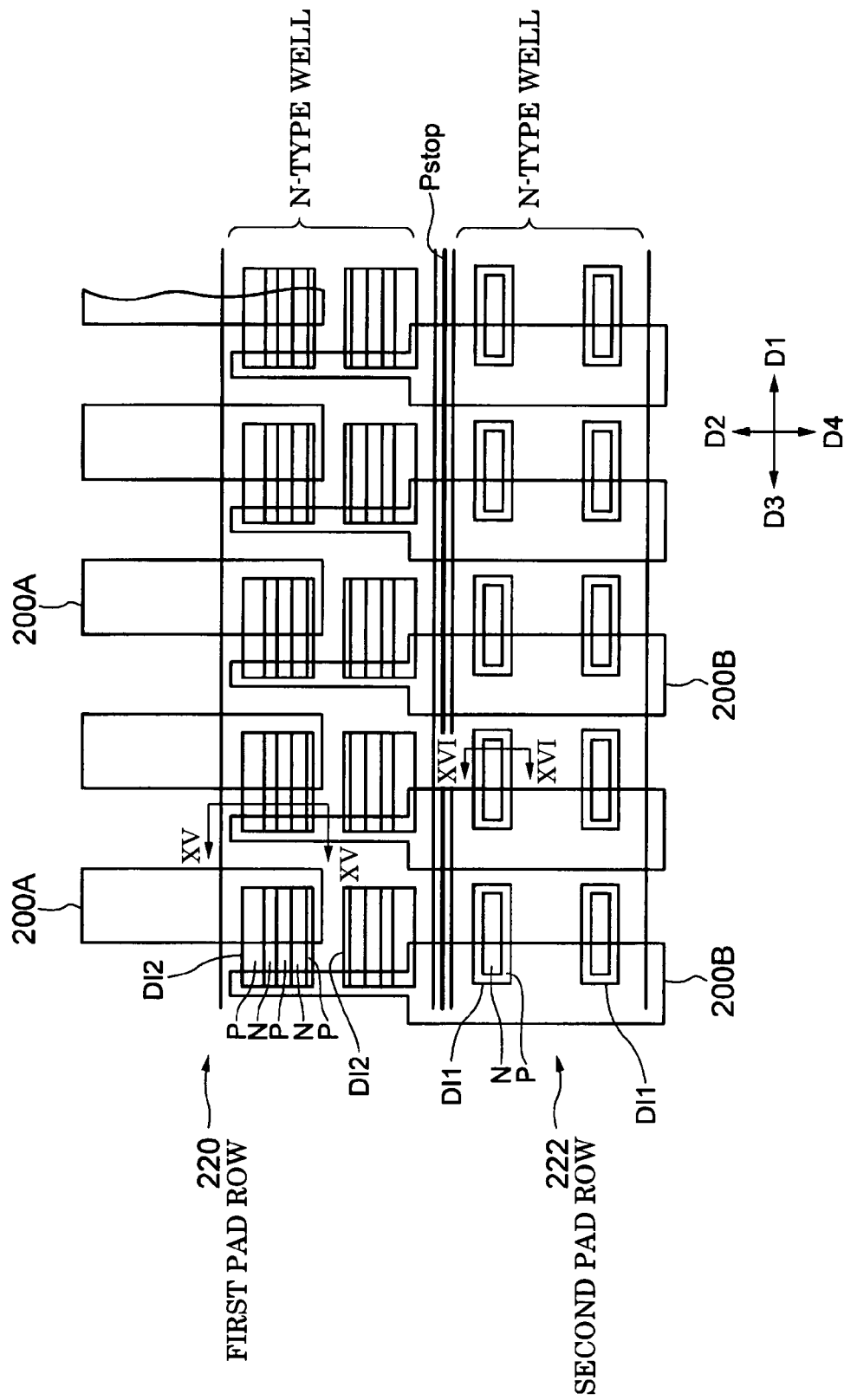
FIG. 13 is a view showing a planar layout of output pads of a data driver and electrostatic discharge protection elements formed in a lower layer of the output pads.

FIG. 13 shows a planar layout of the first and second diodes DI1 and DI2 formed on a P-type semiconductor substrate or the like and the first and second pad rows 220 and 222.

Figure 14:
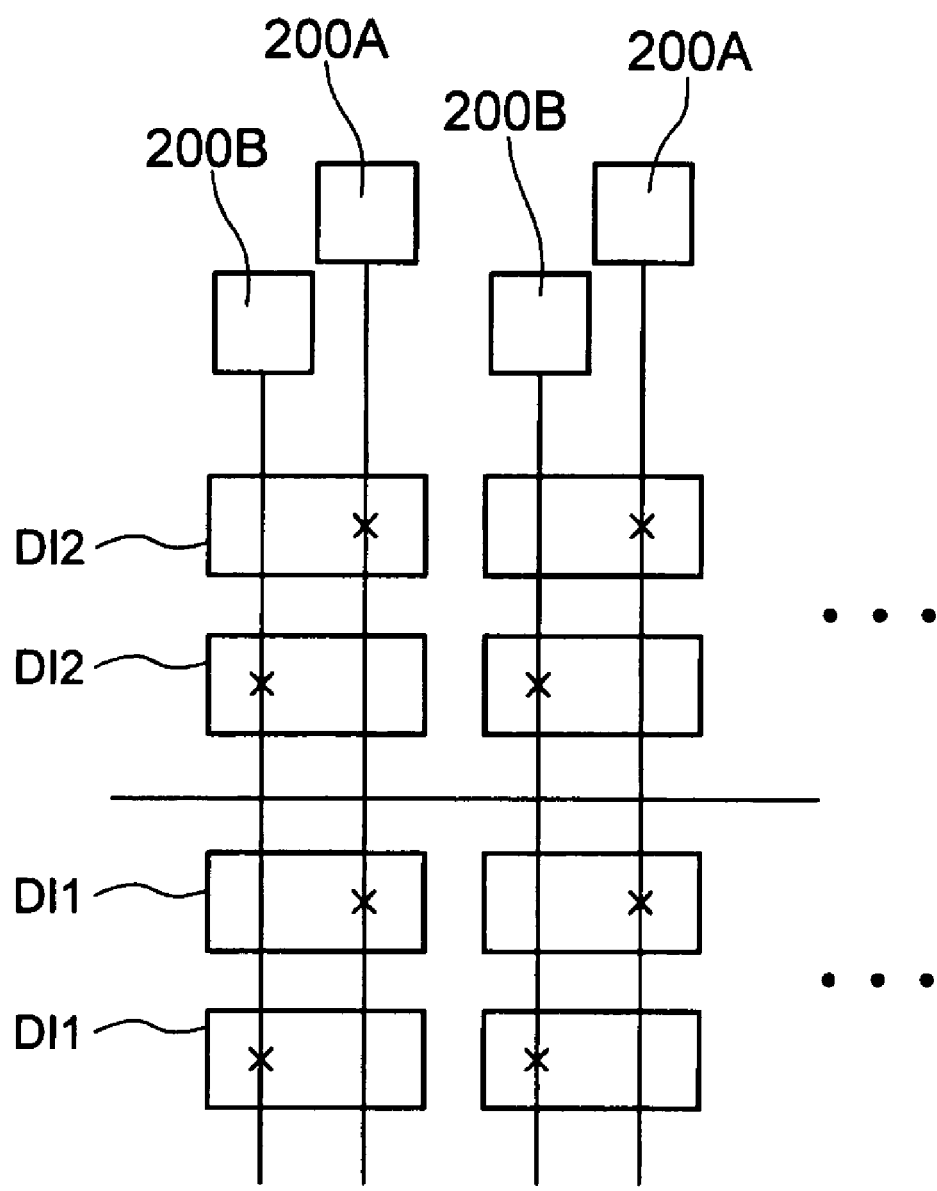
FIG. 14 is a schematic view showing connection of the pads and the electrostatic discharge protection elements shown in FIG. 13.

As shown in FIG. 13, two first diodes DI1 and two second diodes DI2 connected with the pad 200A in the first pad row 220 and the pad 200B in the second pad row 222 having a close positional relationship in the direction D4 are formed in a lower layer of regions at least partially including the pads 200A and 220B, respectively. In FIG. 13, one second diode DI2 is formed in a lower layer of the region including the pad 200A, and one second diode DI2 and two first diodes DI1 are formed in a lower layer of the region including the pad 200B. Note that the layout is not limited thereto. FIG. 14 schematically shows the connection relationship between the pads 200A and 200B and the first and second diodes DI1 and DI2. As shown in FIGS. 13 and 14, the first and second diodes DI1 and DI2 and the first and second diodes DI1 and DI2 respectively connected with the pads 200A and 200B are formed by utilizing a region in a lower layer of the regions in which the pads 200A and 200B are formed. In FIG. 13, the pad 200A is formed in an upper layer of the second diode DI2, and the pad 200B is formed in an upper layer of the first and second diodes DI1 and DI2. The terminal narrowly extending from the pad 200B is a terminal for via connection with the lower layer.

In order to realize this layout, the first and second electrostatic discharge protection elements DI1 and DI2 (four in total) connected with the two pads 200A and 200B adjacent in the direction D4 are formed along the direction D4.

The second electrostatic discharge protection element DI2 connected with the pad 200A in the first row is formed in a region positioned in a lower layer of the pad 200A, the first electrostatic discharge protection element DI1 connected with the pad 200B in the second row is formed in a region positioned in a lower layer of the pad 200B, the second electrostatic discharge protection elements DI2 connected with the pads 200A and 200B are adjacently disposed in the direction D4, and the remaining first electrostatic discharge protection elements DI1 are adjacently disposed in the direction D4. According to this layout, the number of well separations can be reduced by forming the electrostatic discharge protection elements (DI1 or DI2) having the same structure on one side, and the connection distances between the pads 200A and 200B and the first and second electrostatic discharge protection elements DI1 and DI2 (four in total) can be reduced.

For example, when alternately arranging the first and second electrostatic discharge protection elements DI1 and DI2 in the direction D4, the dimension of the integrated circuit device 10 in the direction D4 is increased due to an increase in the number of well separations. In this embodiment, since it is unnecessary to alternately arrange the first and second electrostatic discharge protection elements DI1 and DI2, the connection distance can be reduced.

As shown in FIG. 13, the impurity layers of the first and second electrostatic discharge protection elements DI1 and DI2 have a horizontally long shape in which the impurity layers have a short dimension in the direction D4 and a long dimension in the direction D1. This aims at reducing the interconnect impedance. Specifically, the impedance can be reduced by connecting the electrostatic discharge protection element and the pad using a wide metal interconnect. Therefore, a horizontally long shape is suitable for the impurity layer. When forming a vertically long impurity layer while reducing the dimension in the direction D4, it is necessary to form a two-finger configuration by separating one electrostatic discharge protection element into two sections and to connect the two electrostatic discharge protection elements using a metal interconnect. However, since a large number of interconnects are formed in the second metal interconnect layer ALB, the width of the metal interconnect cannot be increased, whereby the interconnect impedance is increased. According to this embodiment, the interconnect impedance can be reduced by forming a horizontally long impurity layer.

According to the above-described layout, the width W of the integrated circuit device 10 in the direction D2 can be further reduced in comparison with the case of forming the first and second diodes DI1 and DI2 in a region other than the region under the pads.

In FIGS. 13 and 14, the second electrostatic discharge protection elements DI2 are formed on the pad 200A side, and the first electrostatic discharge protection elements DI1 are formed on the pad 200B side. Note that the arrangement may be the reverse of the arrangement shown in FIGS. 13 and 14.

Figure 15:
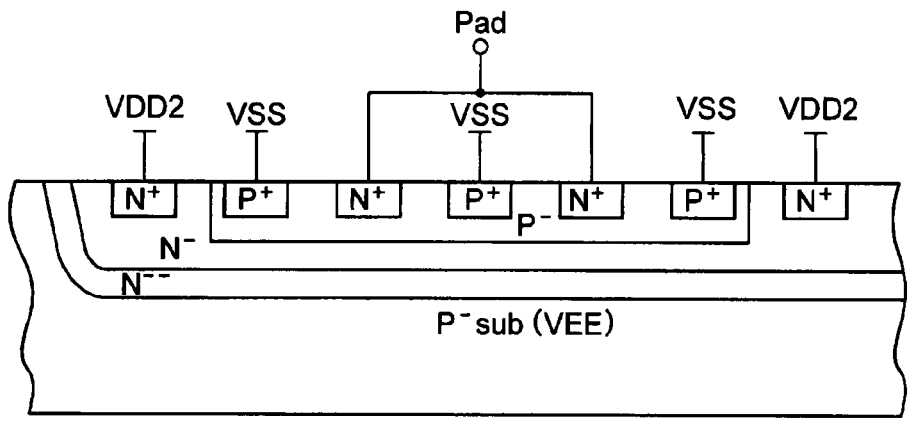
FIG. 15 is a cross-sectional view along the line XV-XV in FIG. 13.

The cross-sectional structures of the first and second diodes DI1 and DI2 shown in FIG. 13 are described below. FIG. 15 schematically shows the cross section of the second diode DI2 shown in FIG. 13 along the line XV-XV. The dimensions shown in FIG. 15 differ from the dimensions shown in FIG. 13. Since an output transistor of the data driver is a middle-voltage (MV) (VDD2-VSS) transistor, a triple-well structure is employed in order to isolate the output transistor from a potential VEE of a P-type semiconductor substrate Psub. As shown in FIG. 15, N-type wells having impurity concentrations of $N^{--}$ and $N^-$ are formed in the P-type semiconductor substrate Psub, a P-type well is formed in the N-type well, and P-type and N-type high-concentration impurity layers are formed in the P-type well to form a triple-well structure. In this triple-well structure, the N-type wells having impurity concentrations of $N^{--}$ and $N^-$ are continuously formed in the direction D1 shown in FIG. 13 and are used by the second electrostatic discharge protection elements DI2 adjacent in the direction D4 (see FIG. 13). The second diode DI2 is formed by a PN junction by setting the P-type impurity layer at the potential VSS in the P-type well electrically isolated from the P-type semiconductor substrate Psub and connecting the pad 200 with the N-type impurity layer. Note that the impurity layers are adjacently disposed in the actual device.

Figure 16:
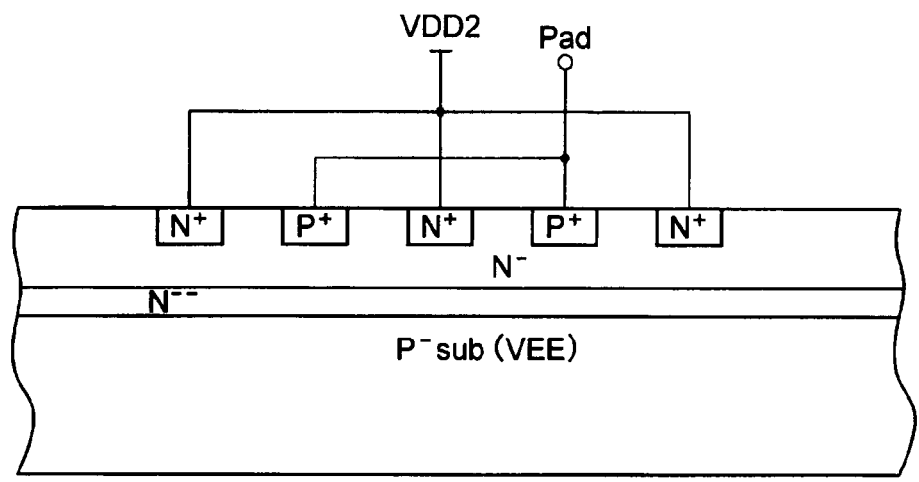
FIG. 16 is a cross-sectional view along the line XVI-XVI in FIG. 13.

FIG. 16 (cross-sectional view along the line XVI-XVI in FIG. 13) shows the cross-sectional structure of the formation region of the first diode DI1 isolated from the triple-well structure by a P stop layer Pstop on the boundary line shown in FIG. 13.

In FIG. 16, the formation region of the first diode DI1 has a twin-well structure. As shown in FIG. 16, N-type wells having impurity concentrations of $N^{--}$ and $N^-$ are formed in the P-type semiconductor substrate Psub, and P-type and N-type high-concentration impurity layers are formed in the N-type well to form a twin-well structure. In this twin-well structure, the N-type wells having impurity concentrations of $N^{--}$ and $N^-$ are continuously formed in the direction D1 shown in FIG. 13 and are used by the first electrostatic discharge protection elements DI1 adjacent in the direction D4 (see FIG. 13). The first diode DI1 is formed by a PN junction by setting the N-type impurity layer at the potential VDD2 in the N-type well electrically isolated from the P-type semiconductor substrate Psub and connecting the pad 200 with the P-type impurity layer.

The P-type impurity layers of the first electrostatic discharge protection elements DI1 connected with the pads 200A and 200B are formed in the shape of a ring in plan view, as shown in FIG. 13. This aims at increasing the base length of a parasitic bipolar transistor formed between the P-type impurity layers adjacent in the direction D1 to reduce the capability of the parasitic bipolar transistor. Moreover, since a breakdown occurs between the P-type impurity layers adjacent in the direction D1 when the opposing area of the P-type impurity layers is small, the opposing area is increased by utilizing the ring shape to prevent a breakdown.

In the four memory MB regions shown in FIGS. 5A and 5B, the fourth metal layer ALD is used as a shield layer for preventing a formation of a capacitive coupling between the bitlines BL and the fifth metal layer ALE.

Figure 17A:
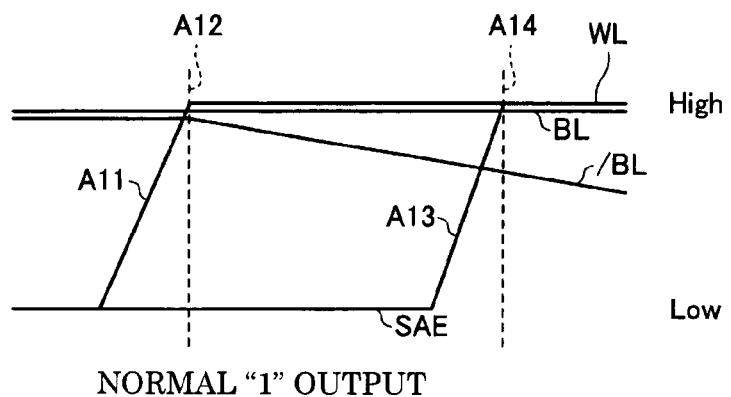
FIGS. 17A and 17B are views illustrative of detection of bit output data.
Figure 17B:
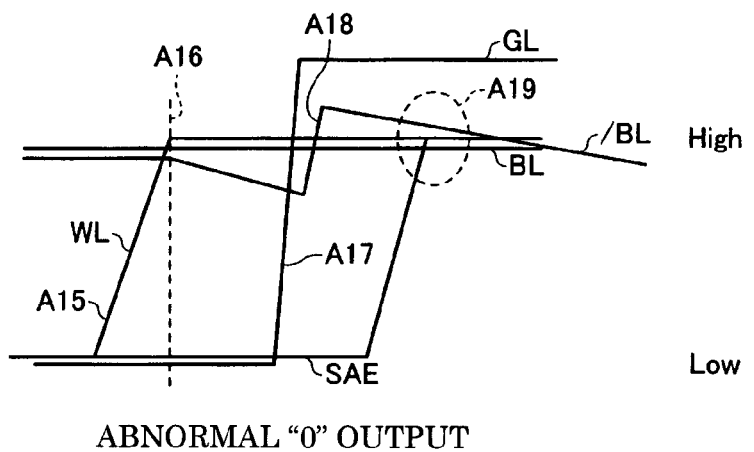

FIGS. 17A and 17B are views illustrative of reading data from a memory cell MC. FIGS. 17A and 17B show the case where the memory cell MC holds data "1" for convenience of illustration. As indicated by A11 in FIG. 17A, the potential of a wordline WL is increased when the wordline WL has been selected. When the potential of the wordline WL has reached a High level at the timing indicated by A12, the potential of the bitline /BL falls from the High level toward a Low level.

When a sense amplifier enable signal SAE which enables a sense amplifier has risen as indicated by A13 in FIG. 17A, the potential difference between the bitlines BL and /BL is detected by the sense amplifier at the timing indicated by A14. In this case, since the potential of the bitline /BL is lower than the potential of the bitline BL, the sense amplifier detects data "1", for example.

The data held in the memory cell MC can be accurately detected as described above. FIG. 17B shows the case where abnormal data is detected. FIG. 17B shows the case where a power supply interconnect GL to which a voltage higher than the voltage VDD is supplied is formed in the fifth metal layer ALE in an upper layer of the region in which the memory cells MC are arranged.

As indicated by A15 in FIG. 17B, the potential of the wordline WL is increased when the wordline WL has been selected. When the potential of the wordline WL has reached the High level at the timing indicated by A16, the potential of the bitline /BL falls from the High level toward the Low level. When a signal has been supplied to the power supply interconnect GL as indicated by A17 so that the potential of the power supply interconnect GL has exceeded the High level, the potential of the bitline /BL rapidly increases, as indicated by A18. This rapid increase occurs due to the capacitive coupling between the bitlines BL and /BL and the power supply interconnect GL. A capacitor is formed by an inter-layer dielectric between the bitlines BL and /BL and the power supply interconnect GL when forming the power supply interconnect GL in an upper layer of the bitlines BL and /BL. When the potential of the power supply interconnect GL has increased, the potentials of the bitlines BL and /BL also increase due to the capacitive coupling between the bitlines BL and /BL and the power supply interconnect GL. Specifically, when forming the power supply interconnect GL in an upper layer (the fifth metal layer) of the bitlines BL and /BL (the second or the third metal layer), the potentials of the bitlines BL and /BL become unstable.

When the sense amplifier enable signal SAE has risen, the sense amplifier 211 detects the potential difference between the bitlines BL and /BL. In this case, the potential of the bitline /BL, which has risen as indicated by A18, does not reach a level lower than the potential of the bitline BL, as indicated by A19. As a result, the sense amplifier 211 detects the potential difference in a state in which the potential of the bitline /BL is higher than the potential of the bitline BL.

The sense amplifier 211 determines that the potential of the bitline BL is lower than the potential of the bitline /BL to detect data "0". Specifically, data "0" is detected from the memory cell MC from which data "1" should be detected, that is, an abnormal value is detected.

Figure 18:
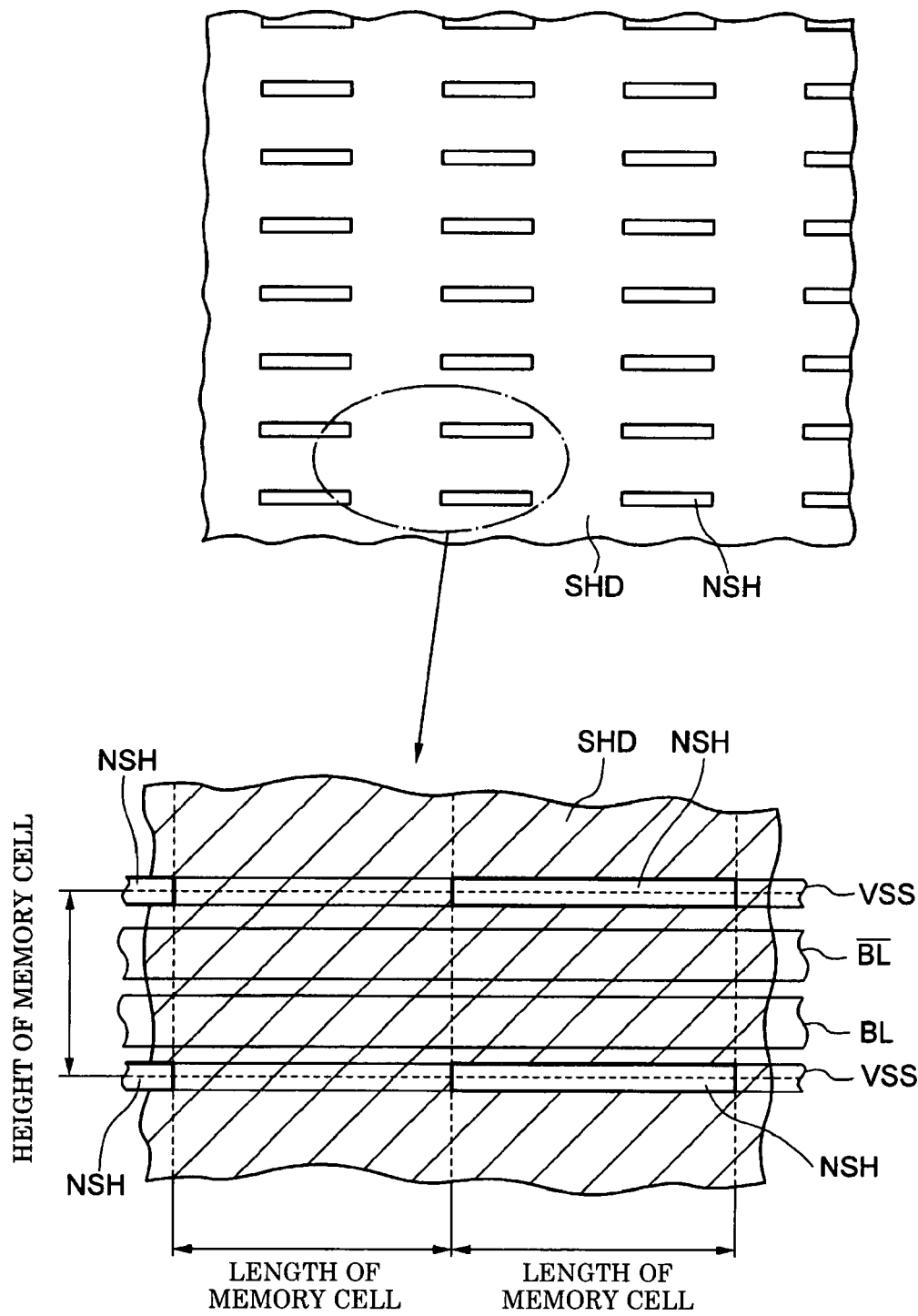
FIG. 18 is a view illustrative of a bitline shield layer in a RAM region.

In this embodiment, the above-described abnormal reading can be prevented by providing a shield interconnect SHD (bitline protection line in a broad sense) at the forth metal layer between the bitlines BL and the power supply interconnect GL in the memory cell MC, as shown in FIG. 18.

The shield interconnect SHD shown in FIG. 18 is formed in a lattice pattern having non-shielding regions NSH. The memory cell MC has dimensions indicated by the broken line. The bitlines BL and /BL are formed at the center of the memory cell MC along the lateral direction, and VSS interconnects are formed on both sides of the bitlines in parallel to the bitlines. The shield interconnect SHD in an upper layer of the bitlines BL and /BL and the VSS interconnects has the non-shielding region NSH which has a width equal to that of the VSS interconnect and a length equal to that of one memory cell MC and is utilized as a degassing hole when forming the shield interconnect SHD. Since the VSS interconnect is necessarily provided in a lower layer of the non-shielding region NSH, the VSS interconnect provides shielding effects.

The shield interconnect SHD is continuously formed in the vertical direction and the horizontal direction by forming the bitline shield interconnect SHD in a lattice pattern, whereby the shield interconnect SHD can be suitably utilized as a VSS interconnect layer.

In this embodiment, the shield interconnect SHD is utilized as an interconnect layer which connects the VSS terminal and the VSS interconnect shown in FIG. 11. As a result, the resistance of the resistor R shown in FIG. 11 can be reduced, whereby the impedance of the interconnect reaching the VSS terminal can be reduced.

The power supply protection element 208 shown in FIG. 11 is provided for a plurality of pads 200. In particular, when the number of power supply protection elements 208 is small and the interconnect distance between the power supply protection element 208 and the VSS terminal is long, the interconnect impedance can be reduced to a large extent by connecting the power supply protection element 208 and the VSS terminal using the shield interconnect SHD.

4.3 Output Pad and Electrostatic Discharge Protection Element of Scan Driver

An electrostatic discharge protection element connected with a pad of the scan driver SB (SB1 and SB2) shown in FIGS. 5A and 5B may also be disposed under the pad. The relationship between the output pad 200, the first and second electrostatic discharge protection elements DI1 and DI2, and the power supply protection element 208 of the scan driver is the same as that shown in FIG. 11, that is, the scan driver is the same as the data driver as to the functional circuit. However, since the scan driver outputs a high voltage, the potential of the first power supply line 204 is the high potential VDDH higher than the potential VDD2, and the potential of the second power supply line 206 is the low potential VEE lower than the ground potential VS (indicated in the parenthesis in FIG. 11).

Figure 19:
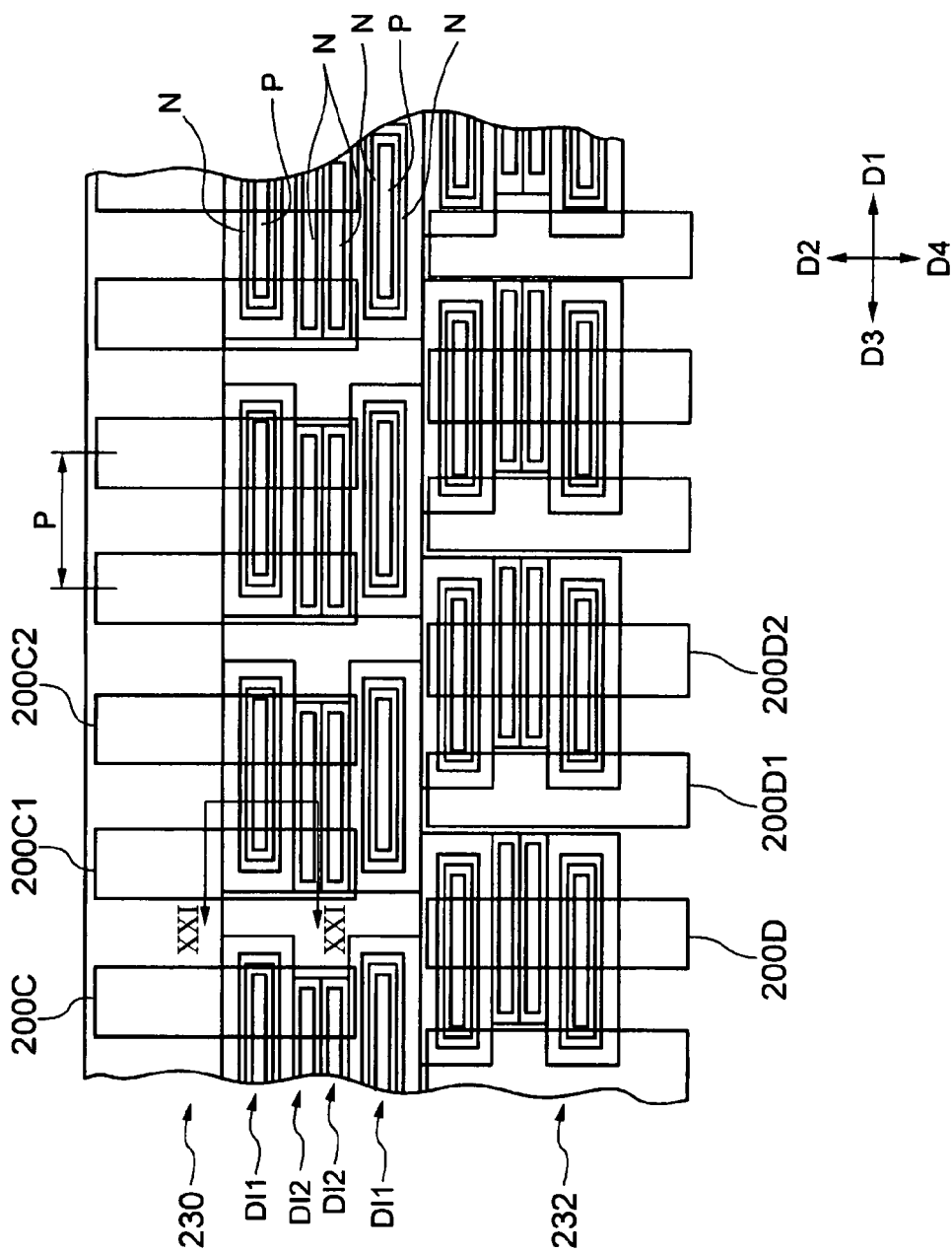
FIG. 19 is a view showing a planar layout of output pads of a scan driver and electrostatic discharge protection elements formed in a lower layer of the output pads.

In FIG. 19, the output pad region of the scan driver includes N (N is an integer equal to or larger than two) pad rows such as first and second pad rows 230 and 232 (i.e. N=2). The first and second pad rows 230 and 232 are disposed at an interval in the direction D4, and a plurality of pads 200 (pads 200C in the first pad row 230 and pads 200D in the second pad row 232) are arranged at intervals in the direction D1 perpendicular to the direction D4. In FIG. 19, the pads 200C and 200D in the first and second pad rows 230 and 232 are disposed in a staggered arrangement in which the pads 200C and 200D are not disposed linearly in the direction D4. Note that the pads 200C and 200D in the first and second pad rows 230 and 232 may be disposed linearly in the direction D4.

FIG. 19 shows a planar layout of the first and second diodes DI1 and DI2 formed on a P-type semiconductor substrate and the first and second pad rows 230 and 232.

Figure 20:
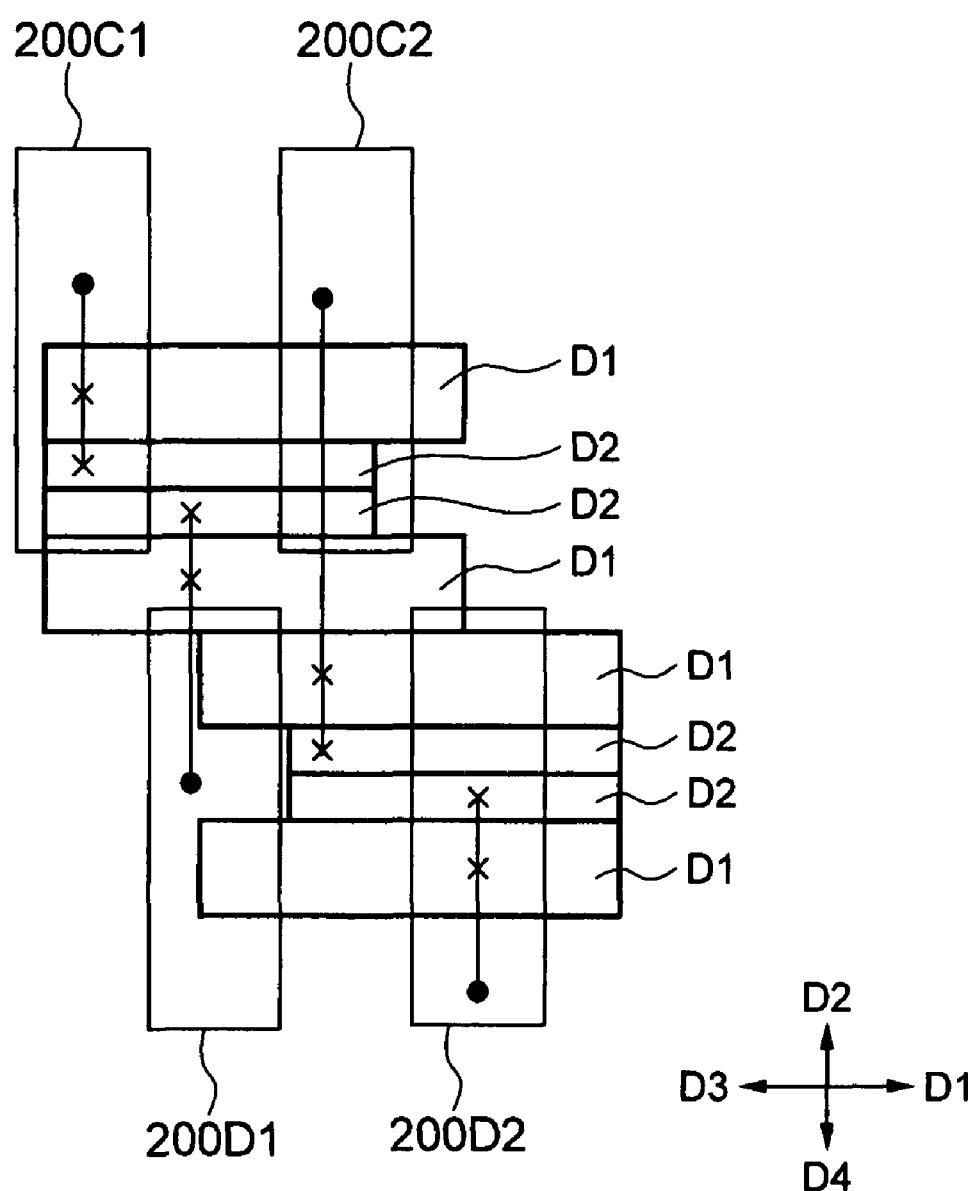
FIG. 20 is a schematic view showing connection of the pads and the electrostatic discharge protection elements shown in FIG. 19.

As shown in FIG. 19, each of the two pad rows includes M (M is an integer equal to or larger than two) pads such as M=2 pads, and (N×M)=4 electrostatic discharge protection elements DI1, DI2, DI2, and DI1 connected with the (N×M)=4 pads are provided in a lower layer of regions including part or all of each of the (N×M)=4 pads 200C1, 200C2, 200D1, and 200D2. FIG. 20 schematically shows the connection relationship between the pads 200C1, 200C2, 200D1, and 200D2 and the four first diodes DI1 and the four second diodes DI2. As shown in FIGS. 19 and 20, the four first diodes DI1 and the four second diodes DI2 connected with the pads 200C1, 200C2, 200D1, and 200D2 are formed by utilizing a region in a lower layer of the regions in which the pads 200C1, 200C2, 200D1, and 200D2 are formed. In FIG. 19, the pads 200C1 and 200C2 are formed in an upper layer of the two first diodes DI1 and the two second diodes DI2, and the pads 200D1 and 200D2 are formed in an upper layer of the two first diodes DI1 and the two second diodes DI2.

In order to realize this layout, the first and second electrostatic discharge protection elements DI1 and DI2 (eight in total) connected with the four pads 200C1, 200C2, 200D1, and 200D2 adjacent in the directions D1 and D4 are formed along the direction D4.

The dimensions of the impurity layers of the first and second electrostatic discharge protection elements DI1 and DI2 in the direction D1 are greater than a pad pitch P in the second direction. As a result, the first and second electrostatic discharge protection elements DI1 and DI2 can exhibit characteristics as electrostatic discharge protection elements while being reduced in dimension in the direction D4. Moreover, the interconnect impedance can be reduced in the same manner as described for the data driver output.

The electrostatic discharge protection elements in FIG. 19 are arranged so that the diodes DI1, DI2, DI2, and DI1 are disposed in that order in the direction D4 in a lower layer of the first and second pad rows 230 and 232, differing from FIG. 13.

When connecting the elements as shown in FIG. 20, the above mirror-image arrangement can reduce the interconnect length from each of the pads 200C1, 200C2, 200D1, and 200D2 to the electrostatic discharge protection element, whereby the interconnect impedance can be reduced. This is because the outermost pads 200C1 and 200D2 among the four pads 200C1, 200C2, 200D1, and 200D2 in the directions D1 and D3 are connected with the first and second electrostatic discharge protection elements D1 and D2 positioned in a lower layer of the pads 200C1 and 200D2. Therefore, the diodes DI2, DI1, DI1, and DI2 may be arranged in that order in the direction D4.

As shown in FIG. 20, when the first and second diodes DI1 and DI2 make a pair, two pairs of the first and second diodes DI1 and DI2 are disposed in a mirror-image arrangement in plan view with respect to the boundary between the two second electrostatic discharge protection elements DI2 adjacent in the direction D4. This facilitates the mask design of the repeating pattern shown in FIG. 19, for example. The order of arrangement of the first and second diodes DI1 and DI2 making up a pair in the direction D4 may be the reverse of that shown in FIG. 19.

In FIG. 19, the formation region of the first diode DI1 and the formation region of the second diode DI2 are not separated, differing from FIG. 13, because the scan driver is a high-voltage (HV) driver using the substrate potential VEE so that the first and second electrostatic discharge protection elements DI1 and DI2 can be formed using a twin-well structure, as described later.

Figure 21:
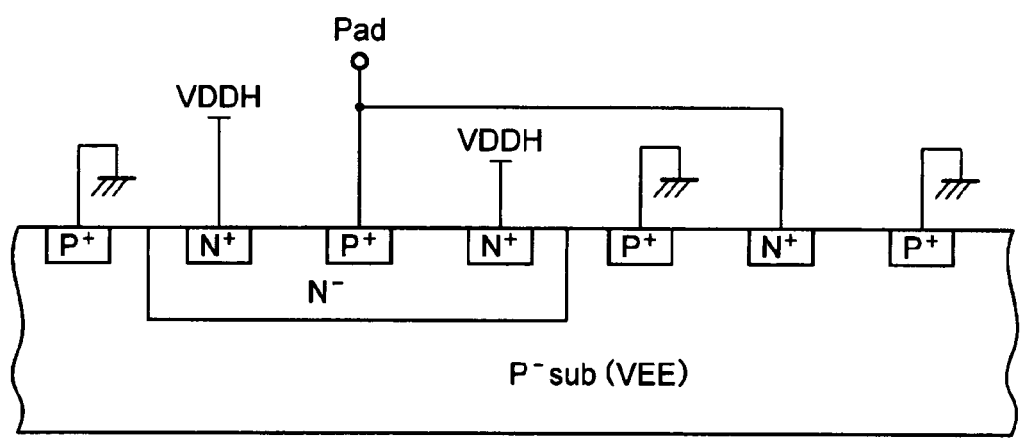
FIG. 21 is a cross-sectional view along the line XXI-XXI in FIG. 19.

The cross-sectional structure of the first and second diodes DI1 and DI2 shown in FIG. 19 is described below. FIG. 21 shows the cross section of the first and second diodes DI1 and DI2 shown in FIG. 19 along the line XXI-XXI. Since the output transistor of the scan driver is an HV (VDDH-VEE) transistor, the potential VEE of the p-type semiconductor Psub can be utilized. Therefore, it is unnecessary to isolate the output transistor from the P-type semiconductor Psub. Accordingly, the first and second electrostatic discharge protection elements DI1 and DI2 can be formed using a twin-well structure.

As shown in FIG. 21, an N-type well having an impurity concentration of N⁻ is formed in the P-type semiconductor substrate Psub, and P-type and N-type high-concentration impurity layers are formed in the N-type well to form a twin-well structure. The N-type impurity layer is set at the potential VDDH and the P-type impurity layer is connected with the pad, whereby the first electrostatic discharge protection element DI1 is formed by utilizing the PN junction of this structure.

A P-type impurity ring is formed to surround the N-type well, and an N-type impurity layer and a P-type impurity layer are formed in the P-type substrate Psub on one side of the P-type ring. The P-type impurity layer is set at the same potential VEE as the P-type substrate Psub, and the N-type impurity layer is connected with the pad. The second electrostatic discharge protection element D2 is formed by utilizing the PN junction of this structure.

5. Electronic Instrument

Figure 22A:
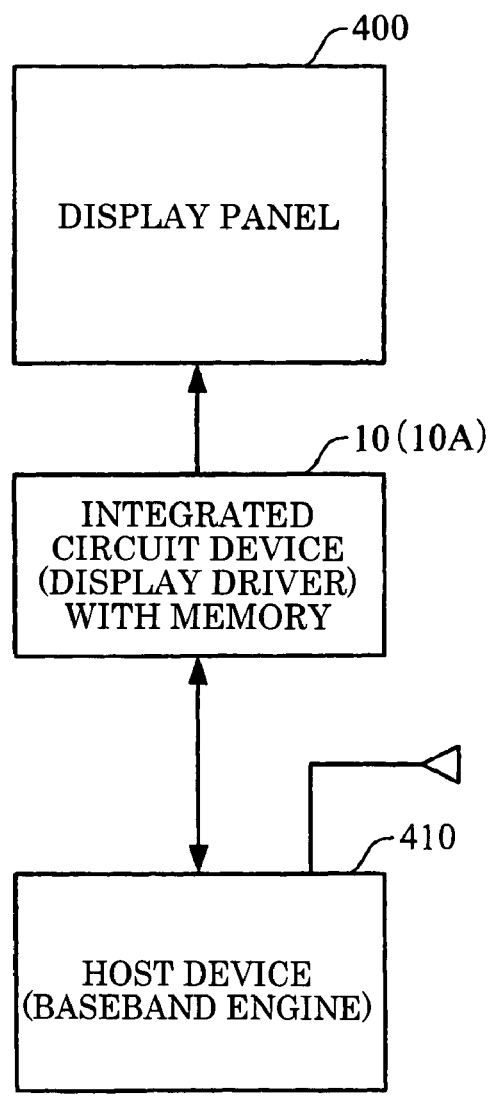
FIGS. 22A and 22B are configuration examples of an electronic instrument.
Figure 22B:
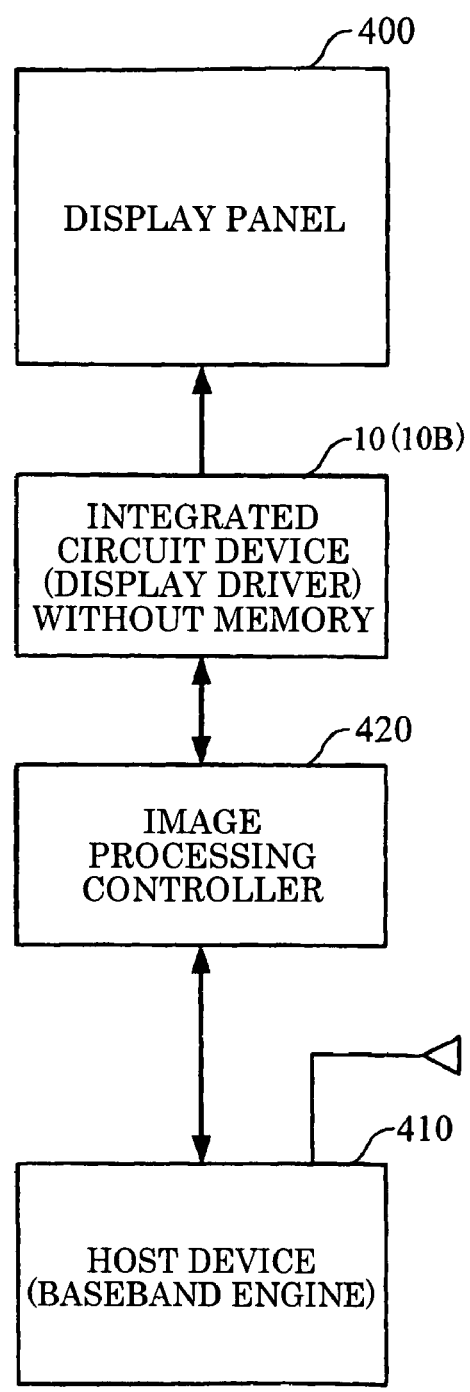

FIGS. 22A and 22B illustrate examples of an electronic instrument (electro-optical device) including the integrated circuit device 10 according to the above embodiment. The electronic instrument may include constituent elements (e.g. camera, operation section, or power supply) other than the constituent elements shown in FIGS. 22A and 22B. The electronic instrument according to this embodiment is not limited to a portable telephone, but may be a digital camera, PDA, electronic notebook, electronic dictionary, projector, rear-projection television, portable information terminal, or the like.

In FIGS. 22A and 22B, a host device 410 is a microprocessor unit (MPU), a baseband engine (baseband processor), or the like. The host device 410 controls the integrated circuit device 10 as a display driver. The host device 410 may perform processing as an application engine and a baseband engine or processing as a graphic engine such as compression, decompression, or sizing. An image processing controller (display controller) 420 shown in FIG. 22B performs processing as a graphic engine such as compression, decompression, or sizing instead of the host device 410.

A display panel 400 includes a plurality of data lines (source lines), a plurality of scan lines (gate lines), and a plurality of pixels specified by the data lines and the scan lines. A display operation is realized by changing the optical properties of an electro-optical element (liquid crystal element in a narrow sense) in each pixel region. The display panel 400 may be formed by an active matrix type panel using switch elements such as a TFT or TFD. The display panel 400 may be a panel other than an active matrix type panel, or may be a panel other than a liquid crystal panel.

In FIG. 22A, the integrated circuit device 10 may include a memory. In this case, the integrated circuit device 10 writes image data from the host device 410 into the built-in memory, and reads the written image data from the built-in memory to drive the display panel. In FIG. 22B, the integrated circuit device 10 may not include a memory. In this case, image data from the host device 410 is written into a memory provided in the image processing controller 420. The integrated circuit device 10 drives the display panel 400 under control of the image processing controller 420.

6. Modifications

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention. Any term cited with a different term having a broader meaning or the same meaning at least once in the specification and the drawings can be replaced by the different term in any place in the specification and the drawings. The configuration, arrangement, and operation of the integrated circuit device and the electronic instrument are not limited to those described in the above embodiments. Various modifications and variations may be made.

The above embodiments have been described taking the display driver as an example. Note that the invention may also be applied to various semiconductor integrated circuits. The pad according to the above embodiments means a metal pad in a strict sense. An opening is formed in an insulating film on the metal pad, and a bump is formed in the opening. However, the pad is not limited to a pad used for a bump. The type of pad is not limited insofar as the pad can be utilized as an external terminal to which static electricity is applied.

The above embodiments have been described taking the data driver output and the scan driver output. Note that the invention may also be applied to other output terminals, input terminals, or input-output terminals. The input terminal merely differs in function from FIG. 11 in that the P-type transistor and the N-type transistor are not provided. Since the electrostatic discharge protection element and the power supply protection element shown in FIG. 11 are also necessary for the input terminal, the invention may be applied to the input terminal.

What is claimed is:

1. A semiconductor integrated circuit having a first side, a second side, a third side and a fourth side, the first side being shorter than the second side, the third side being shorter than the fourth side, the first side being opposite to the third side, the second side being opposite to the fourth side, a first direction being a direction from the first side toward the third side, and a second direction being a direction from the second side toward the fourth side, the semiconductor integrated circuit comprising:

a first interface region provided along the fourth side of the semiconductor integrated circuit, the first interface region including a plurality of first pads arranged in the first direction in a plan view, the first interface region including a plurality of second pads arranged in the first direction in a plan view, a row of the plurality of first pads being positioned between the fourth side of the semiconductor integrated circuit and a row of the plurality of second pads in a plan view;

a second interface region provided along the second side, the second interface region including a plurality of third pads arranged in the first direction in a plan view; and a plurality of circuit blocks positioned between the first interface region and the second interface region, the plurality of circuit blocks being arranged in the first direction in a plan view, the plurality of circuit blocks including a data driver block that drives at least a data line of a display panel, the data driver block including at least a data latch circuit, a D/A conversion circuit, and an operational amplifier, no other circuit blocks of the plurality of circuit blocks being positioned between the data driver block and the first interface region in the second direction in a plan view, no other circuit blocks of the plurality of circuit blocks being positioned between the data driver block and the second interface region in the second direction in a plan view, one of the plurality of first pads having an approximately rectangular shape having a long side along the second direction and a short side along the first direction in a plan view, the one of the plurality of first pads being electrically connected with a first one of a plurality of electronic discharge protection elements and a second one of the plurality of electronic discharge protection elements, the first one of the plurality of electronic discharge protection elements being electrically connected with a first power supply line and the one of the plurality of first pads, the second one of the plurality of electronic discharge protection elements being electrically connected with a second power supply line and the one of the plurality of first pads, at least a part of the first one of the plurality of electronic discharge protection elements and at least a part of the second one of the plurality of electronic discharge protection elements being positioned underneath the one of the plurality of first pads, an impurity layer of at least one of the first one of the plurality of electronic discharge protection elements and the second one of the plurality of electronic discharge protection elements having a shape in which a dimension in the first direction is greater than a dimension in the second direction.

2. The semiconductor integrated circuit as defined in claim 1, the first one of the plurality of electronic discharge protection elements being positioned underneath a region of the row of the plurality of first pads in a plan view, the second one of the plurality of electronic discharge protection elements being positioned underneath a region of the row of the plurality of first pads in a plan view, a third one of the plurality of electronic discharge protection elements being electrically connected with the one of the plurality of second pads, the third one of the plurality of electronic discharge protection elements and the first one of the plurality of electronic discharge protection elements being arranged in the first direction in a plan view, a fourth one of the plurality of electronic discharge protection elements being electrically connected with the one of the plurality of second pads, the fourth one of the plurality of electronic discharge protection elements and the second one of the plurality of electronic discharge protection elements being arranged in the first direction in a plan view.

3. The semiconductor integrated circuit as defined in claim 2, a well in which the first one of the plurality of electronic discharge protection elements is formed and a well in which the third one of the plurality of electronic discharge protection elements is formed arranged in the first direction in a plan view, a well in which the second one of the plurality of electronic discharge protection elements is formed and a well in which the fourth one of the plurality of electronic discharge protection elements is formed arranged in the first direction in a plan view, the well in which the first one of the plurality of electronic discharge protection elements is formed and the well in which the third one of the plurality of electronic discharge protection elements is formed being separated in the first direction in a plan view.

4. The semiconductor integrated circuit as defined in claim 2, the second one of the plurality of electronic discharge protection elements being disposed in a triple well in a plan view.

5. The semiconductor integrated circuit as defined in claim 1, the impurity layer of the first one of the plurality of electronic discharge protection elements being formed in a shape of a ring in a plan view.

6. The semiconductor integrated circuit as defined in claim 1, a power supply protection element being positioned between the first and second power supply lines.

7. The semiconductor integrated circuit as defined in claim 6, the plurality of circuit blocks including:

a RAM which stores data displayed on a display panel, the RAM having a bitline protection interconnect layer which protects a bitline, the bitline protection interconnect layer being electrically connected with the second power supply line and the power supply protection element.

8. The semiconductor integrated circuit as defined in claim 1, the plurality of first pads being arranged at an equal pitch along the first direction, the row of the plurality of first pads and the row of the plurality of second pads adjacently disposed in the second direction in a plan view, the row of the plurality of first pads and the row of the plurality of second pads being shifted in the first direction by a half pitch of the equal pitch.

9. An electronic instrument comprising:
the semiconductor integrated circuit as defined in claim 1, the display panel having the data line.

10. A semiconductor integrated circuit having a first side, a second side, a third side and a fourth side, the first side being shorter than the second side, the third side being shorter than the fourth side, the first side being opposite to the third side, the second side being opposite to the fourth side, a first direction being a direction from the first side toward the third side, and a second direction being a direction from the second side toward the fourth side, the semiconductor integrated circuit comprising:

a first interface region provided alongside the fourth side of the semiconductor integrated circuit, the first interface region including a plurality of first pads arranged in the first direction in a plan view, the first interface region including a plurality of second pads arranged in the second direction in a plan view, a row of the plurality of first pads being positioned between the fourth side of the semiconductor integrated circuit and a row of the plurality of second pads in a plan view;

a second interface region provided along the second side, the second interface region including a plurality of third pads arranged in the first direction in a plan view; and a plurality of circuit blocks positioned between the first interface region and the second interface region, the plurality of circuit blocks being arranged in the first direction in a plan view, the plurality of circuit blocks including a data driver block that drives at least a data line of a display panel, the data driver block including at least a data latch circuit and a D/A conversion circuit, no other circuit blocks of the plurality of circuit blocks being positioned between the data driver block and the first interface region in the second direction in a plan view, no other circuit blocks of the plurality of circuit blocks being positioned between the data driver block and the second interface region in the second direction in a plan view, one of the plurality of first pads having an approximately rectangular shape having a long side along the second direction and a short side along the first direction in a plan view, the one of the plurality of first pads being electrically connected with a first one of a plurality of electronic discharge protection elements and a second one of the plurality of electronic discharge protection elements, the first one of the plurality of electronic discharge protection elements being electrically connected with a first power supply line and the one of the plurality of first pads, the second one of the plurality of electronic discharge protection elements being electrically connected with a second power supply line and the one of the plurality of first pads, the one of the plurality of first pads being formed in an approximately rectangular shape having a long side along the second direction and a short side along the first direction, at least a part of the first one of the plurality of electronic discharge protection elements and at least a part of the second one of the plurality of electronic discharge protection elements being positioned underneath the one of the plurality of first pads.

11. The semiconductor integrated circuit as defined in claim 10, a third one of the plurality of electronic discharge protection elements being electrically connected with the one of the plurality of second pads, the third one of the plurality of electronic discharge protection elements and the first one of the plurality of electronic discharge protection elements being arranged in the first direction in a plan view, a fourth one of the plurality of electronic discharge protection elements being electrically connected with the one of the plurality of second pads, the fourth one of the plurality of electronic discharge protection elements and the second one of the plurality of electronic discharge protection elements being arranged in the first direction in a plan view, the first one of the plurality of electronic discharge protection elements and the second one of the plurality of electronic discharge protection elements forming a first pair, the third one of the plurality electronic discharge protection elements and the fourth one of the plurality of electronic discharge protection elements forming a second pair, the first pair and the second pair being mirror-image disposed with respect to an axis parallel to the first direction in a lower layer of the row of the plurality of first pads in a plan view.

12. The semiconductor integrated circuit as defined in claim 11, outermost pads of the plurality of first pads in the first direction in a plan view electrically connected with the first one of the plurality of electronic discharge protection elements first and the second one of the plurality of electronic discharge protection elements positioned in a lower layer of the outermost pads of the plurality of first pads.

13. The semiconductor integrated circuit as defined in claim 10, the plurality of circuit blocks including:

a scan driver which drives a scan line of a display panel, the one of the plurality of first pads being electrically connected with an output line of the scan driver.

14. An electronic instrument comprising:

the semiconductor integrated circuit as defined in claim 10, the display panel having the data line.

15. A semiconductor integrated circuit having a first side, a second side, a third side and a fourth side, the first side being shorter than the second side, the third side being shorter than the fourth side, the first side being opposite to the third side, the second side being opposite to the fourth side, a first direction being a direction from the first side toward the third side, and a second direction being a direction from the second side toward the fourth side, the semiconductor integrated circuit comprising:

a first interface region provided alongside the fourth side of the semiconductor integrated circuit, the first interface region including a plurality of first pads arranged in the first direction in a plan view, the first interface region including a plurality of second pads arranged in the second direction in a plan view, a row of the plurality of first pads being positioned between the fourth side of the semiconductor integrated circuit and a row of the plurality of second pads in a plan view;

a second interface region provided along the second side, the second interface region including a plurality of third pads arranged in the first direction in a plan view; and a plurality of circuit blocks positioned between the first interface region and the second interface region, the plurality of circuit blocks being arranged in the first direction in a plan view, one of the plurality of first pads having an approximately rectangular shape having a long side along the second direction and a short side along the first direction in a plan view, the one of the plurality of first pads being electrically connected with a first one of a plurality of electronic discharge protection elements and a second one of the plurality of electronic discharge protection elements, the first one of the plurality of electronic discharge protection elements being electrically connected with a first power supply line and the one of the plurality of first pads, the second one of the plurality of electronic discharge protection elements being electrically connected with a second power supply line and the one of the plurality of first pads, at least a part of the first one of the plurality of electronic discharge protection elements and at least a part of the second one of the plurality of electronic discharge protection elements being positioned underneath the one of the plurality of first pads, an impurity layer of at least one of the first one of the plurality of electronic discharge protection elements and the second one of the plurality of electronic discharge protection elements having a shape in which a dimension in the first direction is greater than a dimension in the second direction.

16. An electronic instrument comprising:

the semiconductor integrated circuit as defined in claim 15, and a display panel having a data line.

* * * * *